(12) United States Patent
Song et al.

(10) Patent No.: US 12,199,140 B2
(45) Date of Patent: Jan. 14, 2025

(54) SEMICONDUCTOR DEVICE AND METHOD FOR MANUFACTURING THE SAME

(71) Applicant: SK hynix Inc., Gyeonggi-do (KR)

(72) Inventors: Jae Hee Song, Gyeonggi-do (KR);
Dong Hyun Lee, Gyeonggi-do (KR);
Kyung Woong Park, Gyeonggi-do (KR); Cheol Hwan Park, Gyeonggi-do (KR); Ki Vin Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/614,757

(22) Filed: Mar. 25, 2024

(65) Prior Publication Data
US 2024/0234489 A1    Jul. 11, 2024

Related U.S. Application Data

(63) Continuation of application No. 17/857,472, filed on Jul. 5, 2022, now Pat. No. 11,973,106.

(30) Foreign Application Priority Data

Dec. 30, 2021    (KR) .......................... 10-2021-0193331

(51) Int. Cl.
*H10B 12/00*    (2023.01)
*H01L 49/02*    (2006.01)

(52) U.S. Cl.
CPC .............. *H01L 28/91* (2013.01); *H01L 28/75* (2013.01); *H01L 28/90* (2013.01); *H10B 12/033* (2023.02)

(58) Field of Classification Search
CPC .............. H01L 28/90–91; H01L 28/75; H10B 12/01; H10B 12/033
See application file for complete search history.

(56) References Cited

U.S. PATENT DOCUMENTS

2020/0395438 A1* 12/2020 Kang .................. H01G 4/1254

* cited by examiner

*Primary Examiner* — Jose R Diaz
(74) *Attorney, Agent, or Firm* — IP & T GROUP LLP

(57) ABSTRACT

A semiconductor device includes a lower electrode; a supporter supporting an outer wall of the lower electrode; a dielectric layer formed on the lower electrode and the supporter; an upper electrode on the dielectric layer; a first interfacial layer disposed between the lower electrode and the dielectric layer and selectively formed on a surface of the lower electrode among the lower electrode and the supporter; and a second interfacial layer disposed between the dielectric layer and the upper electrode, wherein the first interfacial layer is a stack of a metal oxide contacting the lower electrode and a metal nitride contacting the dielectric layer.

16 Claims, 18 Drawing Sheets

SEMICONDUCTOR DEVICE AND METHOD FOR MANUFACTURING THE SAME

CROSS-REFERENCE TO RELATED APPLICATIONS

The present application is a continuation of U.S. patent application Ser. No. 17/857,472 filed on Jul. 5, 2022, which claims priority to Korean Patent Application No. 10-2021-0193331, filed on Dec. 30, 2021, which is incorporated herein by reference in its entirety.

BACKGROUND

1. Field

The present invention relates to a semiconductor device, and more particularly, to a semiconductor device including a capacitor and a method of manufacturing the same.

2. Description of the Related Art

As the degree of integration of the semiconductor device increases, the area occupied by patterns constituting the semiconductor device decreases, and the distance between the patterns become narrower.

In the case of a memory device, as the aspect ratio of the storage node (or lower electrode) of the capacitor increases, it has been proposed to form supporter for supporting the storage node.

SUMMARY

Embodiments of the present invention provide a semiconductor device including a capacitor and a method for manufacturing the same.

According to an embodiment of the present invention, a semiconductor device comprises: a lower electrode; a supporter supporting an outer wall of the lower electrode; a dielectric layer formed on the lower electrode and the supporter; an upper electrode on the dielectric layer; a first interfacial layer disposed between the lower electrode and the dielectric layer and selectively formed on a surface of the lower electrode among the lower electrode and the supporter; and a second interfacial layer disposed between the dielectric layer and the upper electrode, wherein the first interfacial layer is a stack of a metal oxide contacting the lower electrode and a metal nitride contacting the dielectric layer.

According to an embodiment of the present invention, a semiconductor device comprises: a lower electrode; a silicon nitride-based supporter supporting an outer wall of the lower electrode; a dielectric layer formed on the lower electrode and the silicon nitride-based supporter; an upper electrode on the dielectric layer; a first niobium-based interfacial layer disposed between the lower electrode and the dielectric layer and selectively formed on a surface of the lower electrode among the lower electrode and the supporter; and a second niobium-based interfacial layer between the dielectric layer and the upper electrode, wherein the first niobium-based interfacial layer includes a stack of a first niobium oxide contacting the lower electrode and a first niobium nitride contacting the dielectric layer, and the second niobium-based interfacial layer includes a stack of a second niobium oxide contacting the dielectric layer and a second niobium nitride contacting the upper electrode.

According to an embodiment of the present invention, a semiconductor device comprises: a lower electrode; a silicon nitride-based supporter supporting an outer wall of the lower electrode; a dielectric layer including a tetragonal crystalline hafnium oxide and formed on the lower electrode and the silicon nitride-based supporter; an upper electrode on the dielectric layer; a first niobium-based interfacial layer disposed between the lower electrode and the dielectric layer and selectively formed on a surface of the lower electrode among the lower electrode and the supporter; and a second niobium-based interfacial layer disposed between the dielectric layer and the upper electrode, wherein the first niobium-based interfacial layer includes a stack of a niobium oxide contacting the lower electrode and a first niobium nitride contacting a tetragonal crystalline hafnium oxide of the dielectric layer, and the second niobium-based interfacial layer includes a stack of a second niobium oxide contacting the dielectric layer and a second niobium nitride contacting the upper electrode.

According to an embodiment of the present invention, a method of fabricating a semiconductor device comprises: forming a plurality of lower electrodes and a supporter supporting the lower electrodes on a substrate; performing a pre-treatment to form an adsorption inhibitor on a surface of the supporter; after the pre-treatment, selectively forming an interfacial layer including a stack of a metal oxide and a metal nitride on surfaces of the lower electrodes; forming a dielectric layer over the interfacial layer, the lower electrodes, and the supporter; and forming an upper electrode over the dielectric layer. The pre-treatment is performed by using an oxidizing gas or a reducing gas. The pre-treatment uses $H_2$, $D_2$, $NH_3$, $H_2O$, $O_3$, $O_2$, or $H_2O_2$ directly or simultaneously with plasma. The pre-treatment includes a process of adsorbing a surface passivation material onto a surface of the supporter among the lower electrodes and the supporter. The forming of the interfacial layer may include depositing the metal oxide; and exposing the metal oxide to a post-treatment to form the metal nitride. The post-treatment uses $H_2$, $D_2$, or $NH_3$ directly or simultaneously with plasma. The forming of the interfacial layer may include adsorbing a metal precursor; and exposing the adsorbed metal precursor to a post-treatment, the post-treatment includes sequentially flowing an oxidizing gas and a reducing gas. The metal oxide may include niobium oxide, and the metal nitride includes niobium nitride or niobium oxynitride. The metal oxide may include titanium oxide, tantalum oxide, yttrium oxide or molybdenum oxide, and the metal nitride includes titanium nitride, tantalum nitride, yttrium nitride or molybdenum nitride. The dielectric layer may include zirconium oxide, hafnium oxide, HfZrO, a ZAZ ($ZrO_2/Al_2O_3/ZrO_2$) stack, a ZAZA ($ZrO_2/Al_2O_3/ZrO_2/Al_2O_3$) stack, a ZAZAT ($ZrO_2/Al_2O_3/ZrO_2/Al_2O_3/TiO_2$) stack, a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_3$ stack, a $Ta_2O_5/ZrO_2/Al_2O_3/ZrO_2$ stack, $Ta_2O_5/HfO_2/Al_2O_3/HfO_2$ stack, a HZAZH ($HfO_2/ZrO_2/Al_2O_3/ZrO_2/HfO_2$) stack, a ZAH ($ZrO_2/Al_2O_3/HfO_2$) stack, a HAZ ($HfO_2/Al_2O_3/ZrO_2$) stack, a ZHAZHAT ($ZrO_2/HfO_2/Al_2O_3/ZrO_2/HfO_2/Al_2O_3/TiO_2$) stack or combinations thereof. The lower electrode has a cylindrical shape, a pillar shape, or a combination thereof. The method of fabricating a semiconductor device further comprising forming a second interfacial layer between the dielectric layer and the upper electrode. The second interfacial layer may include a stack of niobium oxide and niobium nitride, the niobium oxide contacts the dielectric layer, and the niobium nitride contacts the upper electrode. The second interfacial layer may include a stack of niobium oxide and niobium oxynitride, the niobium oxide contacts the dielectric layer, and the niobium oxynitride contacts the upper electrode. The second interfacial layer may include one metal selected from a group consisting of tantalum, titanium, yttrium and molybdenum, and the second interfacial layer includes an oxide of the metal, a nitride of the metal, an oxynitride of the metal, or a combination thereof. The supporter may include a multi-layered level supporter, the dielectric layer and the multi-layered level supporter are in direct contact with each other, and the dielectric layer and the multi-layered level supporter are in direct contact without the first interfacial layer.

The present technology may reduce capacitor leakage by forming an interfacial layer between the lower electrode and the dielectric layer.

Since the present technology forms an interfacial layer using a stack of a metal oxide and a metal nitride, it is possible to improve a sensing margin by reducing a trap site and a capacitance drop ratio.

The present technology can improve the capacitance of capacitors through pre-treatment, interfacial layer deposition and post-treatment.

These and other features and advantages of the present invention will become apparent to the skilled person in the art from the following drawings and detailed description of various embodiments of the present invention.

DETAILED DESCRIPTION

Figure 1:
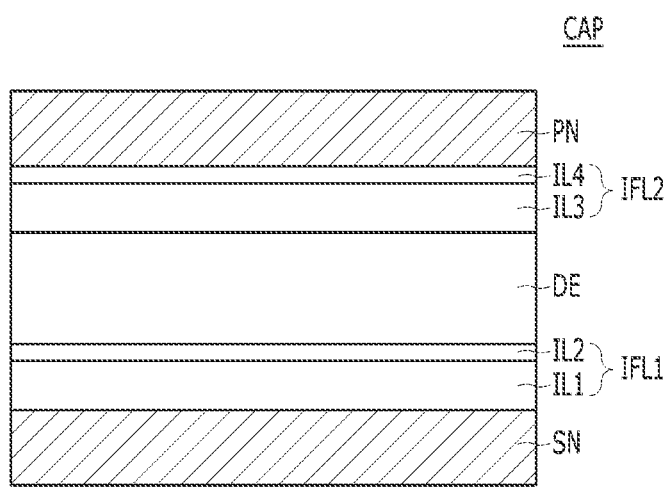
FIG. 1 is a diagram illustrating a capacitor according to an embodiment.

Various embodiments described herein will be described with reference to cross-sectional, plan and block diagrams, which are ideal schematic diagrams of the present invention. Accordingly, the shape of the illustrative drawing may be modified due to manufacturing technology and/or tolerance. Accordingly, the embodiments of the present invention are not limited to the specific form shown, but may also include changes in the form generated according to the manufacturing process. Accordingly, the regions illustrated in the drawings have schematic properties, and the shapes of the regions illustrated in the drawings are intended to illustrate specific shapes of regions of the device, and not to limit the scope of the invention.

Embodiments to be described below propose an engineered interface of the lower electrode and the dielectric layer for improving the sensing margin, increasing the dielectric constant of the dielectric layer, and reducing leakage current. A technology capable of controlling the interface state between the lower electrode/upper electrode and the dielectric film is essential in order to secure a sensing margin where scaling of the effective oxide film thickness (Tox) according to high integration is required.

In embodiments to be described below, the interfacial layers may be modified and implemented to have a high work function, thereby improving the D/R (Dielectric Relaxation) characteristics and capacitor leakage (Cap Leakage) characteristics.

When the interfacial layers are in direct contact with the dielectric layer, they may induce a high dielectric constant due to phase transition, i.e., boost capacitance.

The interfacial layer between the lower electrode and the dielectric layer may cause a bridge as the interfacial layer forms a leakage path on the surface of the supporter supporting the lower electrodes.

In the embodiments to be described below, it is possible to prevent the bridge caused by the interfacial layer by introducing a pre-treatment before deposition of the interfacial layer and a post-treatment after the deposition.

The interfacial layer between the upper electrode and the dielectric layer may prevent leakage current even when the thickness of the dielectric layer is reduced. In addition, the interfacial layer between the upper electrode and the dielectric layer may inhibit oxygen from escaping from the dielectric layer in a reducing atmosphere for forming the upper electrode. Accordingly, a trap site is reduced, so that leakage current and DR (Dielectric Relaxation) characteristics can be improved. When the leakage current and DR characteristics are improved, it is advantageous to improve the sensing margin by reducing the capacitance drop ratio in the high frequency region.

FIG. 1 is a diagram illustrating a capacitor according to an embodiment.

Referring to FIG. 1, the capacitor CAP may include a lower electrode SN, an upper electrode PN, and a dielectric layer DE disposed between the lower electrode SN and the upper electrode PN. The capacitor CAP may further include a first interfacial layer IFL1 disposed between the lower electrode SN and the dielectric layer DE and a second interfacial layer IFL2 disposed between the dielectric layer DE and the upper electrode PN.

The lower electrode SN may include polysilicon or a metal-based material. The metal-based material may include a metal, a metal nitride, a metal silicon nitride, a conductive metal oxide, a metal silicide, a noble metal, or a combination thereof. The lower electrode SN may include titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide (RuO$_2$), iridium (Ir), iridium oxide (IrO$_2$), platinum (Pt), molybdenum (Mo), or a combination thereof.

The dielectric layer DE may include a high-k material having a higher dielectric constant than silicon oxide. A high-k material may include hafnium oxide (HfO$_2$), zirconium oxide (ZrO$_2$), aluminum oxide (Al$_2$O$_3$), titanium oxide (TiO$_2$), tantalum oxide (Ta$_2$O$_5$), niobium oxide (Nb$_2$O$_5$) or strontium titanium oxide (SrTiO$_3$). In another embodiment, the dielectric layer DE may be formed of a composite layer including two or more layers of the aforementioned high-k material. In the present embodiment, the dielectric layer DE may be formed of a zirconium oxide-based material having good leakage current characteristics while sufficiently lowering the equivalent oxide thickness (EOT). For example, the dielectric layer DE may include a ZAZ (ZrO$_2$/Al$_2$O$_3$/ZrO$_2$) stack, a ZAZA (ZrO$_2$/Al$_2$O$_3$/ZrO$_2$/Al$_2$O$_3$) stack, or a ZAZAT (ZrO$_2$/Al$_2$O$_3$/ZrO$_2$/Al$_2$O$_3$/TiO$_2$) stack. In another embodiment, the dielectric layer DE may include a HAH (HfO$_2$/Al$_2$O$_3$/HfO$_2$) stack, a TiO$_2$/ZrO$_2$/Al$_2$O$_3$/ZrO$_2$ stack, a TiO$_2$/HfO$_2$/Al$_2$O$_3$/HfO$_2$ stack, a Ta$_2$O$_5$/ZrO$_2$/Al$_2$O$_3$/ZrO$_2$ stack, or a $Ta_2O_5/HfO_2/Al_2O_3/HfO_2$ stack. In another embodiment, the dielectric layer DE may include hafnium oxide having a tetragonal crystalline phase. In another embodiment, the dielectric layer DE may comprise a HZAZH ($HfO_2/ZrO_2/Al_2O_3/ZrO_2/HfO_2$) stack or an HZAZHA ($HfO_2/ZrO_2/Al_2O_3/ZrO_2/HfO_2/Al_2O_3$) stack. In another embodiment, the dielectric layer DE may include ZAH ($ZrO_2/Al_2O_3/HfO_2$), HAZ ($HfO_2/Al_2O_3/ZrO_2$) or ZHAZHAT ($ZrO_2/HfO_2/Al_2O_3/ZrO_2/HfO_2/Al_2O_3/TiO_2$). In another embodiment, the dielectric layer DE may include a ferroelectric material, an anti-ferroelectric material, or a combination thereof. In another embodiment, the dielectric layer DE may include HfZrO, Hf-rich HfZrO, Zr-rich HfZrO, or a combination thereof. In another embodiment, the dielectric layer DE may include a high bandgap material having a high bandgap energy to improve leakage current. The high bandgap material may include aluminum oxide, silicon oxide, or beryllium oxide. For example, in the above-described ZAZA ($ZrO_2/Al_2O_3/ZrO_2/Al_2O_3$) stack and HZAZHA ($HfO_2/ZrO_2/Al_2O_3/ZrO_2/HfO_2/Al_2O_3$) stack, $Al_2O_3$ may be a high bandgap material, and $Al_2O_3$ may be replaced with silicon oxide or beryllium oxide.

The upper electrode PN may include polysilicon, silicon germanium, metal, metal nitride, metal silicon nitride, conductive metal oxide, metal silicide, noble metal, or a combination thereof. The upper electrode PN may include at least one of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof. For example, the upper electrode PN may be stacked in the order of titanium nitride (TiN), silicon germanium (SiGe), and tungsten nitride (WN).

The first and second interfacial layers IFL1 and IFL2 may be formed of an insulating material. The first and second interfacial layers IFL1 and IFL2 may serve to boost the dielectric constant of the dielectric layer DE. That is, the first and second interfacial layers IFL1 and IFL2 may be used as dielectric constant boosters (k-boosters). The dielectric layer DE may have an increased dielectric constant due to the first and second interfacial layers IFL1 and IFL2. For example, the dielectric layer DE alone has a dielectric constant of about 60, but when the dielectric layer DE and the first and second interfacial layers IFL1 and IFL2 are in contact, the dielectric layer DE may have a dielectric constant greater than 60. The first and second interfacial layers IFL1 and IFL2 serve as a polarization enhancement layer for enhancing the polarization of the dielectric layer DE, and the dielectric constant of the dielectric layer DE may be increased by the enhanced polarization. The first and second interfacial layers IFL1 and IFL2 may serve to suppress leakage current.

The first and second interfacial layers IFL1 and IFL2 and the dielectric layer DE may be made of different materials. The first and second interfacial layers IFL1 and IFL2 include a first high-k material, and the dielectric layer DE may include a second high-k material. The first high-k material and the second high-k material may be different from each other. The dielectric layer DE may contain a first metal, and the first and second interfacial layers IFL1 and IFL2 may contain a second metal. The first metal and the second metal may be different from each other. The first metal may include at least one selected from hafnium, zirconium, aluminum, and titanium. The second metal may include niobium (Nb), tantalum (Ta), titanium (Ti), yttrium (Y), or molybdenum (Mo). The dielectric layer DE may include an oxide of a first metal, and the first and second interfacial layers IFL1 and IFL2 may include an oxide of a second metal. In another embodiment, the dielectric layer DE may be an oxide of a first metal, and the first and second interfacial layers IFL1 and IFL2 may be an oxynitride of a second metal. The dielectric layer DE may include hafnium oxide, zirconium oxide, aluminum oxide, titanium oxide, or a combination thereof. The first and second interfacial layers IFL1 and IFL2 may be formed of a niobium-based material. The first and second interfacial layers IFL1 and IFL2 may include niobium oxide ($Nb_2O_5$), niobium nitride (NbN), or niobium oxynitride (NbON). As the first and second interfacial layers IFL1 and IFL2, niobium nitride (NbN) may be insulative, and the insulating niobium nitride may include nitrogen-rich niobium nitride. In another embodiment, the first and second interfacial layers IFL1 and IFL2 may include a high-k material such as tantalum oxide, titanium oxide, yttrium oxide, or molybdenum oxide.

In another embodiment, the dielectric layer DE may include a high-k material having a tetragonal crystal structure. Hereinafter, a high-k material having a tetragonal crystal structure is abbreviated as a tetragonal high-k material. The tetragonal high-k material may have a higher permittivity than the non-tetragonal high-k material. The non-tetragonal high-k material may have a crystal structure such as an amorphous or monoclinic material.

The tetragonal high-k material may include tetragonal hafnium oxide. The tetragonal hafnium oxide may have a dielectric constant of about 60. The dielectric layer DE may include tetragonal hafnium oxide having an increased dielectric constant. That is, the dielectric constant of the tetragonal hafnium oxide may be increased by the first and second interfacial layers IFL1 and IFL2. For example, when the tetragonal hafnium oxide has a dielectric constant of about 60, the dielectric constant of the tetragonal hafnium oxide in the first and second interfacial layers IFL1 and IFL2 may be increased to a value greater than 60. The tetragonal hafnium oxide may have a dominant tetragonal crystal structure because of the first and second interfacial layers IFL1 and IFL2. The tetragonal crystal structure of the tetragonal hafnium oxide may be promoted by using the first and second interfacial layers IFL1 and IFL2 as the crystallization promoting layer. Hafnium oxide having a tetragonal crystal structure may have a higher dielectric constant than hafnium oxide having a monoclinic crystal structure, and thus the capacitor CAP may have a relatively large capacitance.

As described above, as the dielectric layer DE has a tetragonal crystal structure, a high dielectric constant may be obtained, and the dielectric constant may be further amplified by the first and second interfacial layers IFL1 and IFL2.

In this embodiment, the first interfacial layer IFL1 may include a stack of a first sub interfacial layer IL1 and a second sub interfacial layer IL2. The first sub-interfacial layer IL1 and the second sub-interfacial layer IL2 may be made of different materials. The first sub-interfacial layer IL1 and the second sub-interfacial layer IL2 may include the same type of metal. The first sub-interfacial layer IL1 and the second sub-interfacial layer IL2 may include niobium, tantalum, titanium, yttrium, or molybdenum.

The first sub interfacial layer IL1 may be a metal oxide, and the second sub-interfacial layer IL2 may be a metal nitride or a metal oxynitride. The second sub-interfacial layer IL2 may be formed by nitriding a portion of the first sub-interfacial layer IL1. For example, the first sub-interfacial layer IL1 and the second sub-interfacial layer IL2 each contain niobium, but the first sub-interfacial layer IL1 may be niobium oxide, and the second sub-interfacial layer IL2 may be niobium nitride or niobium oxynitride. Accordingly, the first interfacial layer IFL1 may include an NbO/NbON stack in which niobium oxide and niobium oxynitride are sequentially stacked, or an NbO/NbN stack in which niobium oxide and niobium nitride are sequentially stacked. The second sub-interfacial layer IL2 may be in direct contact with the dielectric layer DE, and the first sub-interfacial layer IL1 may not be in contact with the dielectric layer DE. The second sub-interfacial layer IL2 may be thinner than the first sub-interfacial layer IL1.

In another embodiment, the first interfacial layer IFL1 may include a TiO/TiON stack, a TiO/TiN stack, a TaO/TaON stack, a TaO/TaN stack, a YO/YON stack, a YO/YN stack, a MoO/MoON stack, a MoO/MoN stack. The YO/YON stack may also be referred to as a stack of yttrium oxide/yttrium oxynitride. The YO/YN stack may also be referred to as a stack of yttrium oxide/yttrium nitride. The MoO/MoON stack may also be referred to as a stack of molybdenum oxide/molybdenum oxynitride, and the MoO/MoN stack may also be referred to as a stack of molybdenum oxide/molybdenum nitride.

In the present embodiment, the second interfacial layer IFL2 may include a stack of the third sub interfacial layer IL3 and the fourth sub interfacial layer IL4. The third sub-interfacial layer IL3 and the fourth sub-interfacial layer IL4 may be made of different materials. The third sub-interfacial layer IL3 and the fourth sub-interfacial layer IL4 may include the same type of metal. The third sub-interfacial layer IL3 and the fourth sub-interfacial layer IL4 may include niobium, tantalum, titanium, yttrium, or molybdenum.

The third sub-interfacial layer IL3 may be a metal oxide, and the fourth sub-interfacial layer IL4 may be a metal nitride or a metal oxynitride. The fourth sub-interfacial layer IL4 may be formed by nitriding a portion of the third sub-interfacial layer IL3. For example, the third sub-interfacial layer IL3 and the fourth sub-interfacial layer IL4 each contain niobium, but the third sub-interfacial layer IL3 may be niobium oxide, and the fourth sub-interfacial layer IL4 may be niobium nitride or niobium oxynitride. Accordingly, the second interfacial layer IFL2 may include an NbO/NbON stack in which niobium oxide and niobium oxynitride are sequentially stacked or an NbO/NbN stack in which niobium oxide and niobium nitride are sequentially stacked. The third sub-interfacial layer IL3 may be in direct contact with the dielectric layer DE, and the fourth sub-interfacial layer IL4 may not be in contact with the dielectric layer DE. The fourth sub-interfacial layer IL4 may be thinner than the third sub-interfacial layer IL3.

In another embodiment, the second interfacial layer IFL2 may include a TiO/TiON stack, a TiO/TiN stack, a TaO/TaON stack, a TaO/TaN stack, a YO/YON stack, a YO/YN stack, a MoO/MoON stack, and a MoO/MoN stack.

In another embodiment, the second interfacial layer IFL2 may be formed solely of the third sub-interfacial layer IL3 or of the fourth sub-interfacial layer IL4. The second interfacial layer IFL2 may be niobium oxide, niobium nitride, or niobium oxynitride.

In this embodiment, when the lower electrode SN and the upper electrode PN include titanium nitride, the dielectric layer DE includes HZAZH, and the first and second interfacial layers IFL1 and IFL2 includes a NbO/NbON stack, the capacitor CAP may include a 'TiN/NbO/NbON/HZAZH/NbO/NbON/TiN' stack.

In another embodiment, the first interfacial layer IFL1 may be formed of niobium oxide alone or niobium oxynitride alone. In another embodiment, the first interfacial layer IFL1 may be formed of niobium nitride alone.

Figure 2:
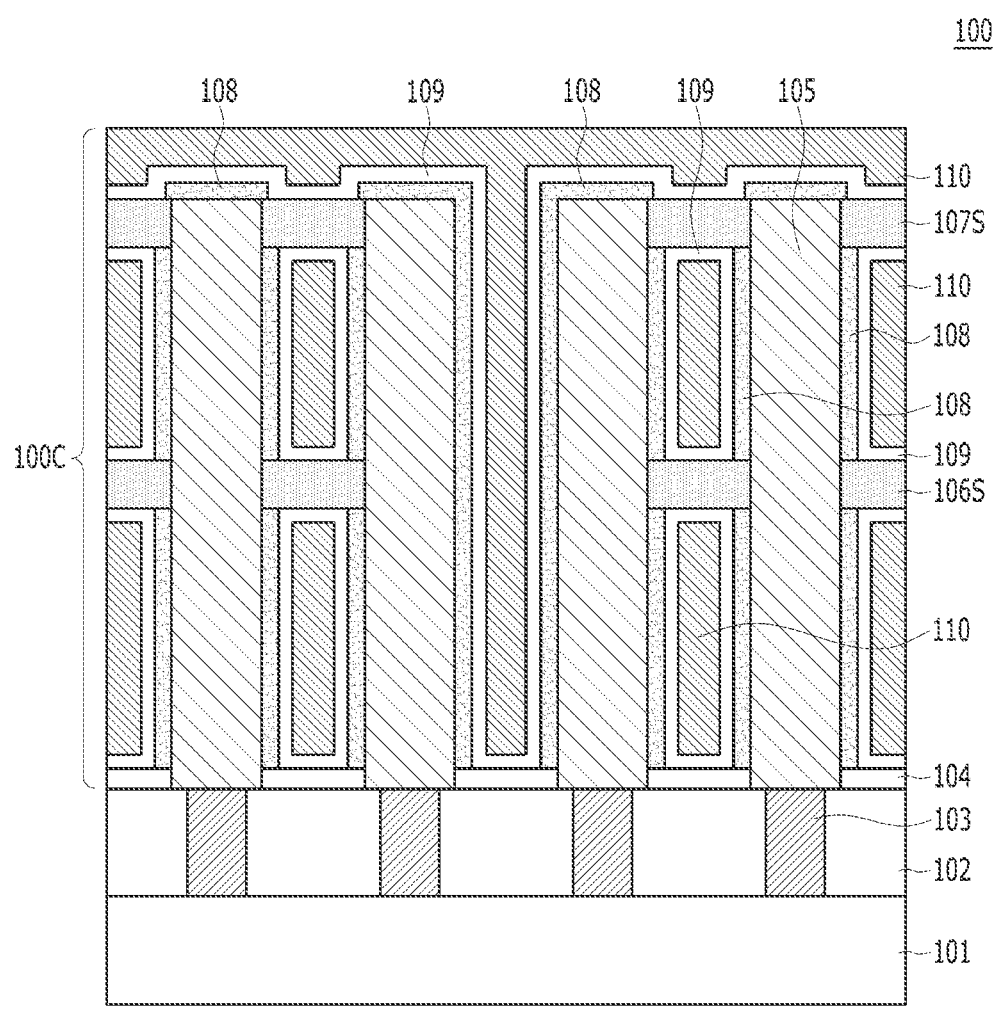
FIG. 2 is a diagram illustrating a semiconductor device according to an embodiment of the present invention.

FIG. 2 is a diagram illustrating a semiconductor device according to an embodiment of the present invention.

Referring to FIG. 2, the semiconductor device 100 may include a substrate 101 and a capacitor structure 100C disposed on the substrate 101. The capacitor structure 100C may include a plurality of lower electrodes 105, supporters 106S and 107S supporting the lower electrodes 105, a dielectric layer 109 disposed on the lower electrodes 105, and an upper electrode 110 over the dielectric layer 109. The capacitor structure 100C may further include an interfacial layer 108 disposed between the lower electrodes 105 and the dielectric layer 109. Each of the lower electrodes 105 may be electrically connected to the substrate 101 through a corresponding contact plug 103. The contact plugs 103 may pass through the inter-dielectric layer 102 on the substrate 101 to be connected to the substrate 101. The contact plugs 103 may also be referred to as storage node contact plugs.

The substrate 101 may include a material suitable for semiconductor processing. For example, the substrate 101 may include a semiconductor substrate, and the semiconductor substrate may be made of a material containing silicon. The semiconductor substrate may include silicon, monocrystalline silicon, polysilicon, amorphous silicon, silicon germanium, monocrystalline silicon germanium, polycrystalline silicon germanium, carbon doped silicon, combinations thereof, or multiple layers thereof. The semiconductor substrate may include other semiconductor materials such as germanium. The semiconductor substrate may include a III/V group semiconductor substrate, for example, a compound semiconductor substrate such as GaAs. The semiconductor substrate may include a silicon on insulator (SOI) substrate.

Bottom portions of the lower electrodes 105 may pass through the etch stop layer 104 to be connected to the contact plugs 103. The lower electrodes 105 may have a pillar shape. The outer walls of the lower electrodes 105 may be supported by supporters 106S and 107S. The supporters 106S and 107S may include a plate-like structure extending horizontally to support the neighboring lower electrodes 105. The supporters 106S and 107S may include at least one or more supporters. For example, the supporters 106S and 107S may include a multi-level dielectric supporter. The supporters 106S and 107S may include an upper-level supporter 107S and a lower-level supporter 106S disposed at a lower level than the upper-level supporter 107S. The upper-level supporter 107S may support the outer walls of the lower electrodes 105, and the lower-level supporter 106S may be vertically spaced apart from the upper-level supporter 107S to support the outer walls of the lower electrodes 105. The upper-level supporter 107S may be thicker than the lower-level supporter 106S. The distance between the upper-level supporter 107S and the lower-level supporter 106S may be smaller than the distance between the lower-level supporter 106S and the etch stop layer 104. When viewed from a top view, the upper-level supporter 107S and the lower-level supporter 106S may each have a plate-shaped structure. The upper-level supporter 107S and the lower-level supporter 106S may be made of the same material or different materials. The upper-level supporter 107S and the lower-level supporter 106S may be formed of a nitride-based material. For example, the upper-level supporter 107S and the lower-level supporter 106S may be formed of silicon nitride, silicon carbon nitride, or silicon boron nitride. The lower electrodes 105 and the supporters 106S and 107S may be in direct contact.

The lower electrodes 105 may include polysilicon or a metal-based material. The metal-based material may include a metal, a metal nitride, a metal silicon nitride, a conductive metal oxide, a metal silicide, a noble metal, or a combination thereof. The lower electrodes 105 may include at least one of titanium (Ti), titanium nitride (TiN), titanium silicon nitride (TiSiN), tantalum (Ta), tantalum nitride (TaN), titanium aluminum nitride (TiAlN), tungsten (W), and tungsten nitride (WN), ruthenium (Ru), ruthenium oxide ($RuO_2$), iridium (Ir), iridium oxide ($IrO_2$), platinum (Pt), molybdenum (Mo), or a combination thereof.

The dielectric layer 109 may include a high-k material having a higher dielectric constant than silicon oxide. A high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). In another embodiment, the dielectric layer 109 may be formed of a composite layer including two or more layers of the aforementioned high-k material. In this embodiment, the dielectric layer 109 may be formed of a zirconium oxide-based material having good leakage current characteristics while sufficiently lowering the equivalent oxide thickness (EOT). For example, the dielectric layer 109 may include a ZAZ ($ZrO_2/Al_2O_3/ZrO_2$) stack, a ZAZA ($ZrO_2/Al_2O_3/ZrO_2/Al_2O_3$) stack, or a ZAZAT ($ZrO_2/Al_2O_3/ZrO_2/Al_2O_3/TiO_2$) stack. In another embodiment, the dielectric layer 109 may include a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, or a $Ta_2O_5/HfO_2/Al_2O_3/HfO_2$ stack. In another embodiment, the dielectric layer 109 may include hafnium oxide having a tetragonal crystalline phase. In another embodiment, the dielectric layer 109 may include a HZAZH ($HfO_2/ZrO_2/Al_2O_3/ZrO_2/HfO_2$) stack. In another embodiment, the dielectric layer 109 may include a ferroelectric material, an anti-ferroelectric material, or a combination thereof. In another embodiment, the dielectric layer 109 may include HfZrO, Hf-rich HfZrO, Zr-rich HfZrO, or a combination thereof.

The upper electrode 110 may include polysilicon, silicon germanium, metal, metal nitride, metal silicon nitride, conductive metal oxide, metal silicide, noble metal, or a combination thereof. The upper electrode 110 may include at least one of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof. For example, the upper electrode 110 may be stacked in the order of titanium nitride (TiN), silicon germanium (SiGe), and tungsten nitride (WN).

The interfacial layer 108 may be selectively formed on the outer walls of the lower electrodes 105. That is, the interfacial layer 108 may not be formed between the upper-level supporter 107S and the dielectric layer 109 and between the lower-level supporter 106S and the dielectric layer 109. An interfacial layer-free structure in which the interfacial layer 108 is not located between the lower electrodes 105 and the supporters 106S and 107S may be provided. The interfacial layer 108 may also be selectively formed on the upper surfaces of the lower electrodes 105. The interfacial layer 108 may extend to be formed on some surfaces of the supporters 106S and 107S. That is, the interfacial layer 108 may not be formed on most surfaces of the supporters 106S and 107S, and may partially cover the contact surfaces of the supporters 106S and 107S and the lower electrodes 105. In an embodiment, the interfacial layer 108 may not be formed on the surface of the supporters 106S and 107S. The interfacial layer 108 may be an insulating material. The interfacial layer 108 may correspond to the first interfacial layer IFL1 of FIG. 1.

The interfacial layer 108 may serve to boost the permittivity of the dielectric layer 109. That is, the interfacial layer 108 may be used as a dielectric constant booster (k-booster). The interfacial layer 108 allows the dielectric layer 109 to have an increased permittivity. For example, the dielectric layer 109 alone may have a dielectric constant of about 60, but when the dielectric layer 109 and the interfacial layer 108 are in contact, the dielectric layer 109 may have a dielectric constant greater than 60. The interfacial layer 108 serves as a polarization enhancement layer for enhancing the polarization of the dielectric layer 109, and the dielectric constant of the dielectric layer 109 may be increased by the enhanced polarization. The interfacial layer 108 may serve to suppress leakage current.

The interfacial layer 108 and the dielectric layer 109 may be different materials. The interfacial layer 108 includes a first high-k material, and the dielectric layer 109 includes a second high-k material, and the first high-k material and the second high-k material may be different materials. The dielectric layer 109 may contain a first metal and the interfacial layer 108 may contain a second metal. The first metal and the second metal may be different from each other. The first metal may include at least one selected from hafnium, zirconium, aluminum, and titanium. The second metal may include niobium (Nb), tantalum (Ta), titanium (Ti), yttrium (Y), or molybdenum (Mo). The dielectric layer 109 may include an oxide of a first metal, and the interfacial layer 108 may include an oxide of a second metal. In another embodiment, the dielectric layer 109 may be an oxide of a first metal, and the interfacial layer 108 may be an oxynitride of a second metal. The dielectric layer 109 may include hafnium oxide, zirconium oxide, aluminum oxide, titanium oxide, or a combination thereof. The interfacial layer 108 may be a niobium-based material. The interfacial layer 108 may include niobium oxide ($Nb_2O_5$), niobium nitride (NbN), or niobium oxynitride (NbON). As the interfacial layer 108, niobium nitride (NbN) may be insulative, and the insulative niobium nitride may include nitrogen-rich niobium nitride. In another embodiment, the interfacial layer 108 may include a high-k material such as tantalum oxide, titanium oxide, yttrium oxide, or molybdenum oxide.

In another embodiment, the dielectric layer 109 may include a high-k material having a tetragonal crystal structure. Hereinafter, a high-k material having a tetragonal crystal structure is abbreviated as a tetragonal high-k material. The tetragonal high-k material may have a higher permittivity than the non-tetragonal high-k material. The non-tetragonal high-k material may have a crystal structure such as an amorphous solid or monoclinic system.

The tetragonal high-k material may include tetragonal hafnium oxide. The tetragonal hafnium oxide may have a dielectric constant of about 60. The dielectric layer 109 may include tetragonal hafnium oxide having an increased dielectric constant. That is, the dielectric constant of the tetragonal hafnium oxide may be increased by the interfacial layer 108. For example, when the tetragonal hafnium oxide has a dielectric constant of about 60, the dielectric constant of the tetragonal hafnium oxide in the interfacial layer 108 may be increased to a value greater than 60. Due to the interfacial layer 108, the tetragonal hafnium oxide may have a dominant tetragonal crystal structure. The tetragonal crystal structure of the tetragonal hafnium oxide may be promoted by using the interfacial layer 108 as a crystallization promoting layer. Hafnium oxide having a tetragonal crystal structure may have a higher dielectric constant than hafnium oxide having a monoclinic crystal structure, and thus the capacitor structure 100C may have a relatively large capacitance.

As described above, as the dielectric layer 109 has a tetragonal crystal structure, it can have a high dielectric constant, and the dielectric constant can be further amplified by the interfacial layer 108.

The interfacial layer 108 of FIG. 2 may include a stack of the first sub-interfacial layer IL1 and the second sub-interfacial layer IL2, similar to the first interfacial layer IFL1 of FIG. 1. Accordingly, the interfacial layer 108 may include an NbO/NbON stack in which niobium oxide and niobium oxynitride are sequentially stacked. The niobium oxynitride may be in direct contact with the dielectric layer 109, and the niobium oxide may not be in contact with the dielectric layer 109.

FIGS. 3A to 3H are diagrams illustrating an example of a method of manufacturing a semiconductor device according to an embodiment of the present invention.

Figure 3A:
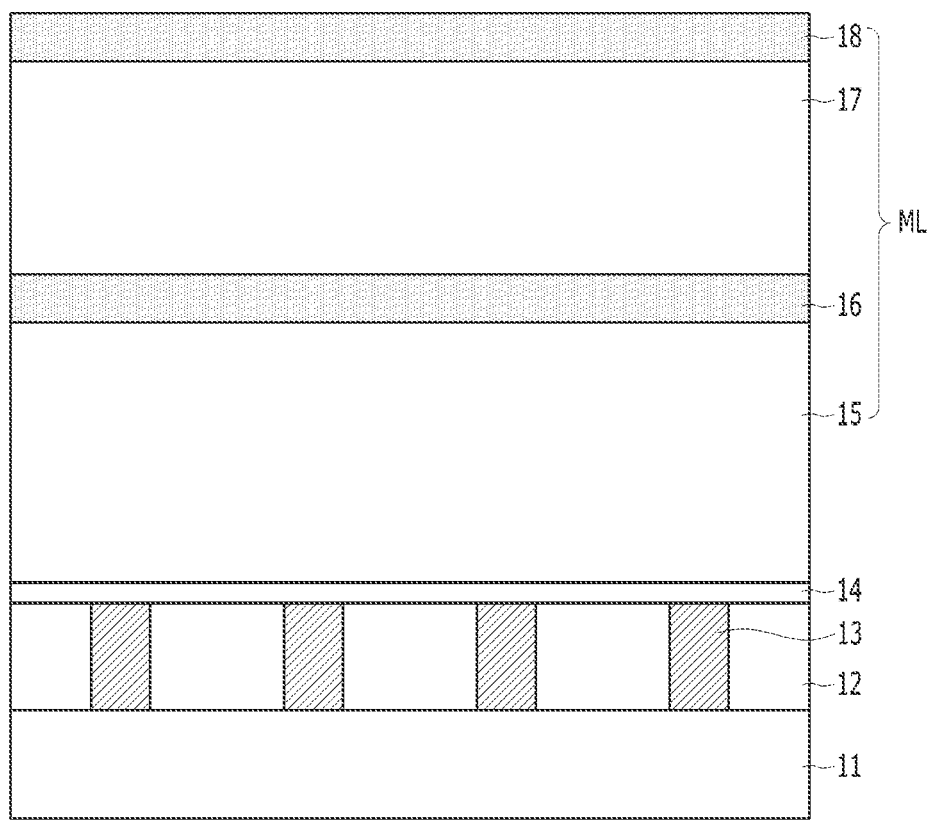
FIGS. 3A to 3H illustrate an example of a method of manufacturing a semiconductor device according to an embodiment of the present invention.

As shown in FIG. 3A, an inter-dielectric layer 12 may be formed on the substrate 11. The substrate 11 may be a semiconductor substrate, for example, a silicon (Si) substrate, a germanium (Ge) substrate, or a silicon-germanium (Si-Ge) substrate. The inter-dielectric layer 12 may include at least one of silicon oxide, silicon nitride, and silicon oxynitride.

Contact plugs 13 may be formed in the inter-dielectric layer 12. The contact plugs 13 may pass through the inter-dielectric layer 12 to be electrically connected to a portion of the substrate 11. The contact plugs 13 may include a semiconductor material, a metal, a metal nitride, a metal silicide, or a combination thereof. For example, the contact plugs 13 may include polysilicon, tungsten, tungsten nitride, titanium nitride, titanium silicon nitride, titanium silicide, cobalt silicide, or a combination thereof. In another embodiment, the contact plugs 13 may be stacked in the order of a semiconductor material, a metal silicide, a metal nitride, and a metal.

A plurality of word lines and bit lines may be formed on and/or in the substrate 11. The inter-dielectric layer 12 may be formed to cover the word lines and the bit lines. Impurity regions may be formed in the substrate 11 on both sides of each of the word lines, and each of the contact plugs 13 may be connected to one of the impurity regions.

An etch stop layer 14 may be formed on the inter-dielectric layer 12 and the contact plugs 13, and a mold structure ML may be formed on the etch stop layer 14. The etch stop layer 14 may include silicon nitride. The mold structure ML may be a stack structure including different insulating materials. For example, the mold structure ML may be stacked in the order of a first mold layer 15, a first support layer 16, a second mold layer 17, and a second support layer 18 on the etch stop layer 14. The first support layer 16 and the second support layer 18 may include a material having an etch selectivity with respect to the first and second mold layers 15 and 17. The first support layer 16 and the second support layer 18 may include a silicon nitride-based material. For example, the first mold layer 15 and the second mold layer 17 may include silicon oxide, and the first support layer 16 and the second support layer 18 may include silicon nitride. In another embodiment, the first support layer 16 and the second support layer 18 may include silicon carbon nitride or silicon boron nitride. In another embodiment, the first support layer 16 and the second support layer 18 may include a stack of silicon nitride and silicon carbon nitride or a stack of silicon nitride and silicon boron nitride.

Figure 3B:
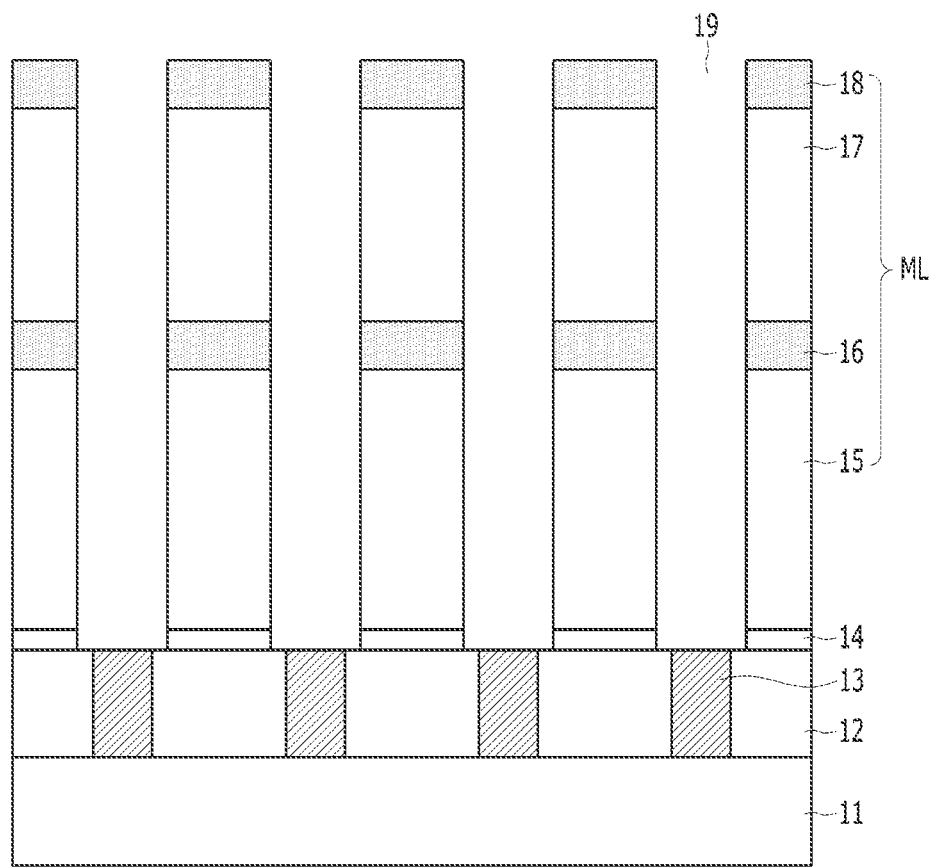

As shown in FIG. 3B, a plurality of openings 19 may be formed in the mold structure ML. The openings 19 may be formed by etching the mold structure ML by using a mask layer. To form the openings 19, the second supporter layer 18, the second mold layer 17, the first supporter layer 16, and the first mold layer 15 may be sequentially etched. The etching process for forming the openings 19 may stop at the etch stop layer 14. To form the openings 19, dry etching, wet etching, or a combination thereof may be used. The openings 19 may also be referred to as holes in which lower electrodes (or storage nodes) are to be formed.

Subsequently, the etch stop layer 14 may be etched to expose the top surface of each of the contact plugs 13 under the openings 19.

The openings 19 may be formed by a double patterning process. For example, the mask layer for forming the openings 19 may have a mesh-shape formed by combining two spacer patterning techniques.

Figure 3C:
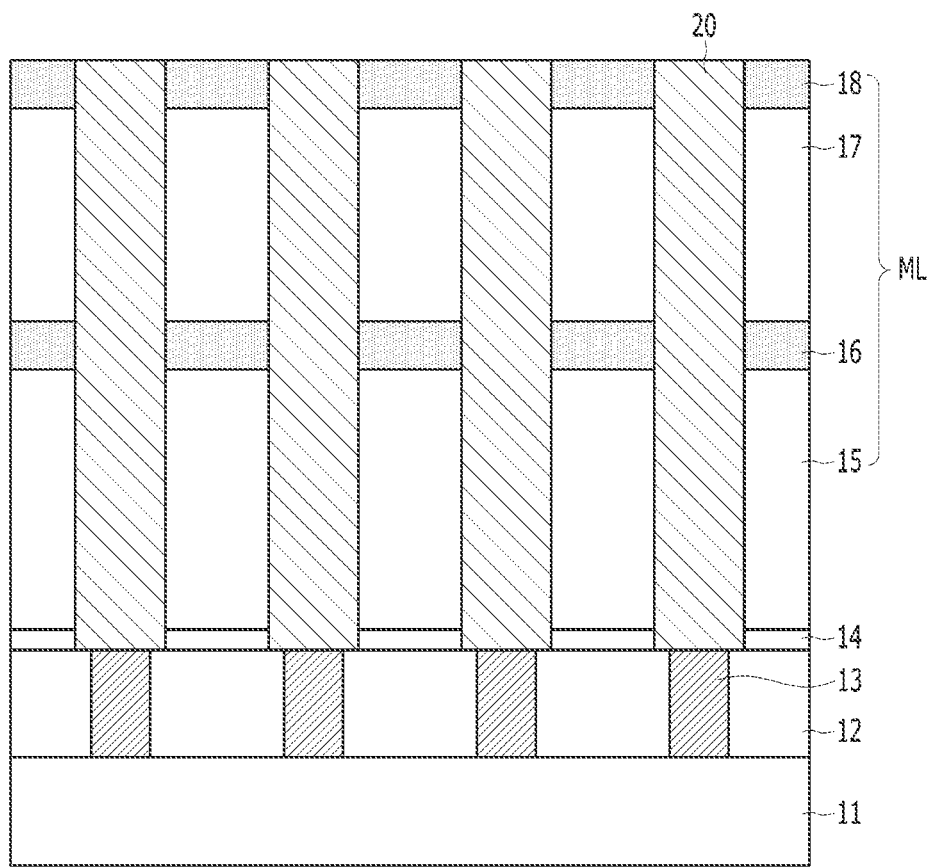

As shown in FIG. 3C, a lower electrode 20 may be formed in each of the openings 19. The lower electrodes 20 may fill the inside of the openings 19. The lower electrodes 20 may have a pillar-shape. To form the pillar-shaped lower electrodes 20, planarization may be performed after depositing a conductive material to gap-fill the openings 19. The lower electrodes 20 may include polysilicon or a metal-based material. The metal-based material may include a metal, a metal nitride, a metal silicon nitride, a conductive metal oxide, a metal silicide, a noble metal, or a combination thereof. The lower electrodes 20 may include at least one of titanium (Ti), titanium nitride (TiN), titanium silicon nitride (TiSiN), tantalum (Ta), tantalum nitride (TaN), titanium aluminum nitride (TiAlN), tungsten (W), and tungsten nitride (WN), ruthenium (Ru), ruthenium oxide ($RuO_2$), iridium (Ir), iridium oxide ($IrO_2$), platinum (Pt), molybdenum (Mo), or a combination thereof. The lower electrodes 20 may include titanium nitride (TiN). The lower electrodes 20 may include titanium nitride (ALD-TiN) formed by atomic layer deposition (ALD). In another embodiment, the lower electrode 20 may include a stack of a cylindrical electrode and a pillar-shaped electrode. For example, the cylindrical electrode may be titanium nitride, and the pillar-shaped electrode may be polysilicon.

Figure 3D:
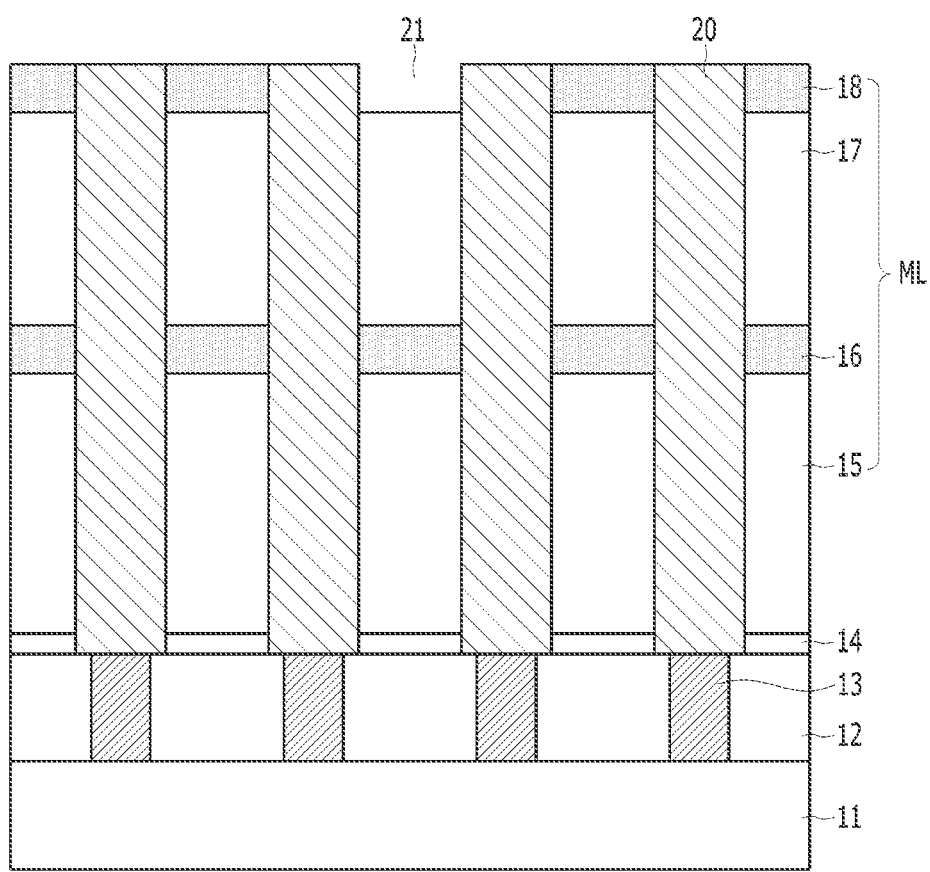

As shown in FIG. 3D, a portion of the second supporter layer 18 may be etched. The upper-level supporter opening 21 and the upper-level supporter 18S may be formed by etching the second supporter layer 18. The upper-level supporter 18S may be a plate-shaped supporter. The upper-level supporter 18S may contact upper outer walls of the lower electrodes 20. Some surfaces of the second mold layer 17 may be exposed by the upper-level supporter 18S. The upper-level supporter 18S may have a shape that partially surrounds the outer walls of the lower electrodes 20. The upper-level supporter 18S may prevent the lower electrodes 20 from collapsing in the subsequent removal process of the second mold layer 17.

When viewed from a top view, the upper-level supporter opening 21 may have a shape that partially exposes outer walls of three adjacent lower electrodes 20. In another embodiment, the upper-level supporter opening 21 may have a shape that partially exposes outer walls of at least four or more lower electrodes 20. The upper-level supporter opening 21 may have a triangular, quadrangular, parallelogram, pentagonal, hexagonal or honeycomb shape in cross section.

The outer walls of all the lower electrodes 20 may be partially exposed by the upper-level supporter opening 21. This may also be referred to as an 'all open lower electrode array.'

In another embodiment, the upper outer wall of the at least one lower electrode 20 may not be exposed by the upper-level supporter opening 21. For example, among the plurality of lower electrodes 20, at least one lower electrode 20 not exposed by the upper-level supporter opening 21 and fully covered by the upper-level supporter 18S may exist. This may also be referred to as a 1 Span lower electrode array.

Figure 3E:
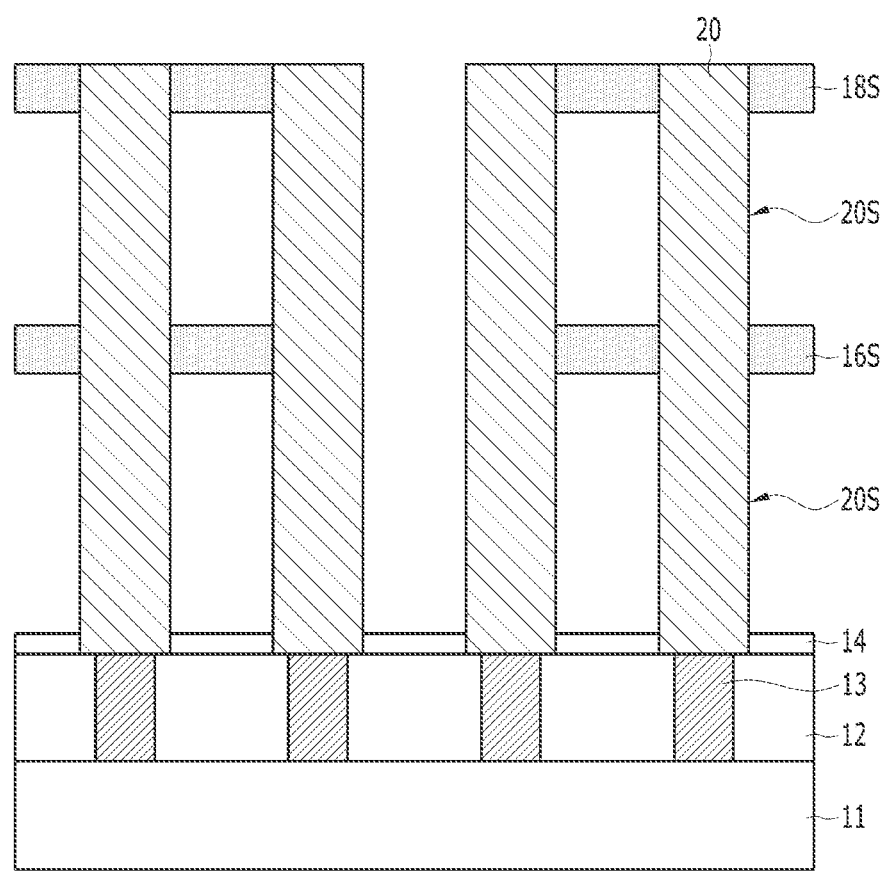

As shown in FIG. 3E, the second mold layer 17 under the upper-level supporter opening 21 may be removed. The second mold layer 17 may be removed by a wet dip-out process. The second mold layer 17 may be selectively removed, and thus the surface of the first supporter layer 16 may be exposed. The wet dip-out process for removing the second mold layer 17 may be performed by using an etching solution capable of selectively removing the second mold layer 17. When the second mold layer 17 includes silicon oxide, the second mold layer 17 may be removed by wet etching using hydrofluoric acid (HF).

After the second mold layer 17 is removed, the first supporter layer 16 may be etched to form a lower-level supporter 16S. The lower-level supporter 16S may contact the outer walls of the lower electrodes 20. Some surfaces of the first mold layer 15 may be exposed by the lower-level supporter 16S. The lower-level supporter 16S may have a shape that partially surrounds the outer walls of the lower electrodes 20. The lower-level supporter 16S may prevent the lower electrodes 20 from collapsing in a subsequent process of removing the first mold layer 15. The lower-level supporter 16S and the upper-level supporter 18S may have the same shape.

Subsequently, the first mold layer 15 may be removed. The first mold layer 15 may be removed by a wet dip-out process. The first mold layer 15 may be selectively removed, and thus the surface of the etch stop layer 14 may be exposed. The wet dip-out process for removing the first mold layer 15 may be performed by using an etching solution capable of selectively removing the first mold layer 15. When the first mold layer 15 includes silicon oxide, the first mold layer 15 may be removed by wet etching using hydrofluoric acid (HF).

The lower-level supporter 16S and the upper-level supporter 18S supporting the outer walls of the lower electrodes 20 may be formed by a series of processes as described above with reference to FIGS. 3B to 3E. The outer wall 20S of the lower electrodes 20 may be partially exposed between the lower-level supporter 16S and the upper-level supporter 18S. Also, the outer wall 20S of the lower electrodes 20 may be partially exposed between the lower-level supporter 16S and the etch stop layer 14.

Figure 3F:
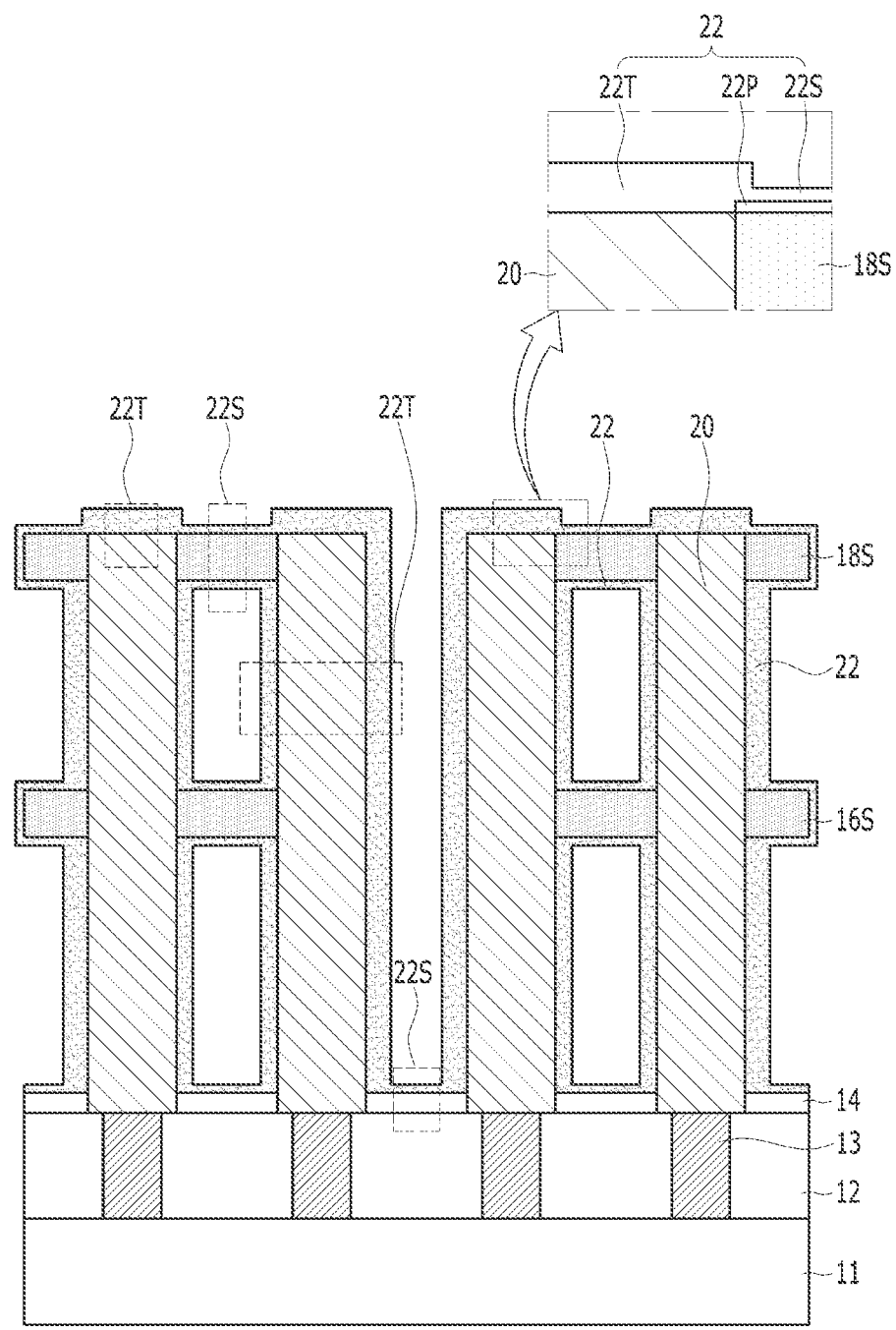

As shown in FIG. 3F, the interfacial material layer 22 may be selectively formed on the surfaces of the upper-level supporter 18S and the lower-level supporter 16S. The interfacial material layer 22 may be formed by selective deposition.

The interfacial material layer 22 may include surface passivation materials 22P, first portions 22S, and second portions 22T. For example, first portions 22S may be formed on the surfaces of the etch stop layer 14, the upper-level supporter 18S, and the lower-level supporter 16S, and second portions 22T may be formed on the surfaces of the lower electrodes 20. The first portions 22S may be thinner than the second portions 22T, and a thickness difference between the first portions 22S and the second portions 22T may be induced by the surface passivation material 22P. The surface passivation material 22P may contact the first portions 22S and may not contact the second portions 22T. The surface passivation material 22P may be selectively formed on the surfaces of the etch stop layer 14, the upper-level supporter 18S, and the lower-level supporter 16S. The surface passivation material 22P may be formed before the first portions 22S and the second portions 22T.

As described above, the interface material layer 22 may be selectively formed thinner on the surfaces of the upper-level supporter 18S and the lower-level supporter 16S than on the surfaces of the lower electrodes 20. The interfacial material layer 22 may be selectively formed thinner on the surface of the etch stop layer 14 than on the surfaces of the lower electrodes 20. As such, the interfacial material layer 22 may be selectively formed thinly on the surface of the silicon nitride-based material, or may be selectively formed thickly on the surface of the polysilicon or metal-based material.

In order to form the interfacial material layer 22 comprising the first portions 22S and the second portions 22T having different thicknesses, the selective deposition of the interfacial material layer 22 may include a surface passivation treatment. When the surface passivation treatment is performed, the surfaces of the etch stop layer 14, the upper-level supporter 18S and the lower-level supporter 16S may be passivated first. Accordingly, excessive adsorption of the interfacial material layer 22 on the surfaces of the stop layer 14, the upper-level supporter 18S, and the lower-level supporter 16S may be prevented. The surface passivation treatment may include adsorption of the surface passivation material 22P. The surface passivation material 22P may be selectively adsorbed onto the surfaces of the etch stop layer 14, the upper-level supporter 18S, and the lower-level supporter 16S. The surface passivation material 22P may not be adsorbed on the surfaces of the lower electrodes 20.

The surface passivation treatment may be performed in situ in the deposition chamber of the interfacial material layer 22. The interfacial material layer 22 may be formed by chemical vapor deposition (CVD) or atomic layer deposition (ALD).

Figure 4A:
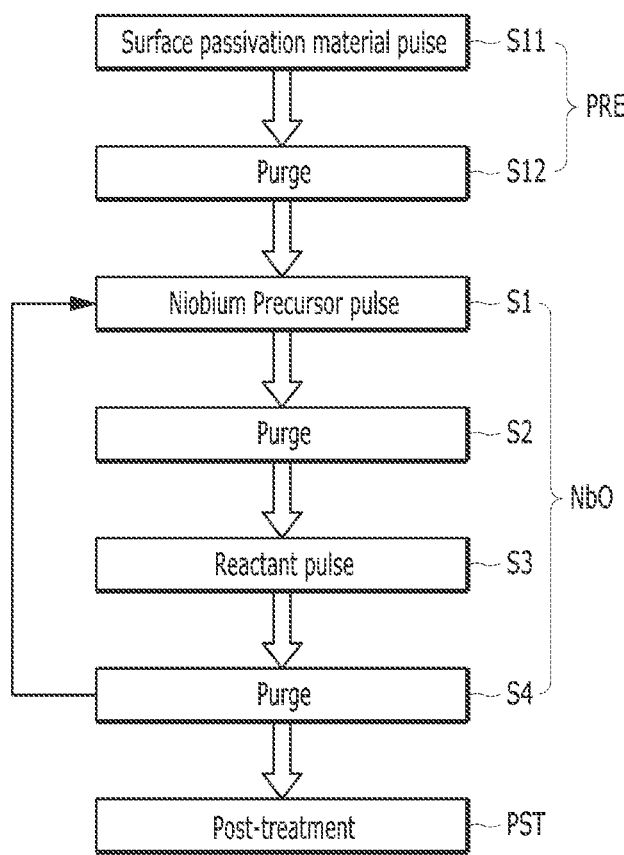
FIGS. 4A to 4C are gas supply timing diagrams illustrating an example of atomic layer deposition of an interface material layer.
Figure 4B:
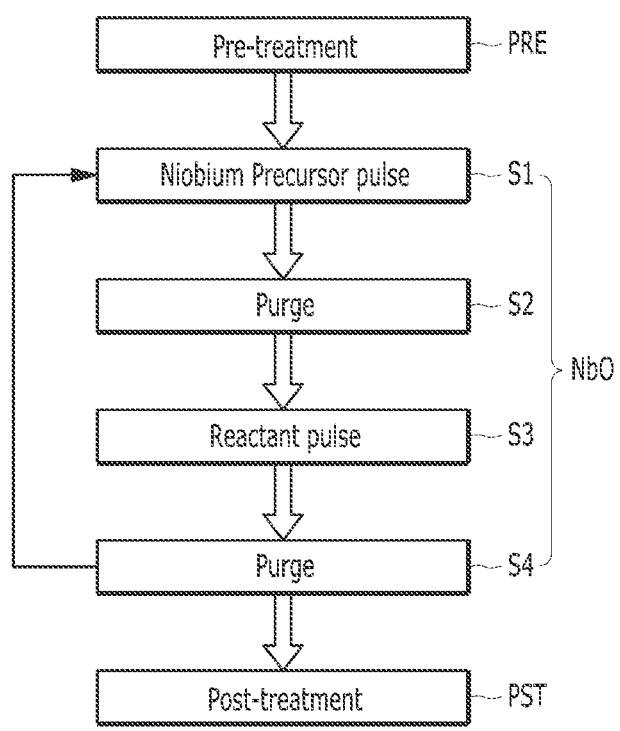
Figure 4C:
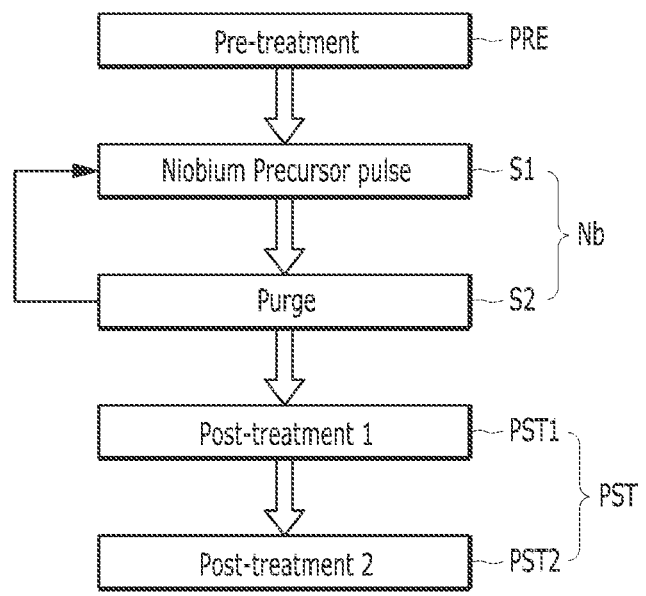

FIGS. 4A to 4C are process flow diagrams illustrating an example of atomic layer deposition of the interfacial material layer 22. FIGS. 4A to 4C illustrate atomic layer deposition of an NbO/NbON stack.

Referring to FIGS. 4A and 4B, the atomic layer deposition of the NbO/NbON stack may include a pre-treatment (PRE), a first cycle (NbO), and a post-treatment PST. The first cycle (NbO) may be repeated several times.

The pre-treatment PRE of FIG. 4A may include surface passivation material pulse S11 and purging S12, and the first cycle (NbO) may include niobium precursor pulse S1, purging S2, reactant pulse S3 and purging S4. The pre-treatment PRE may be performed before the first cycle (NbO), and accordingly, the surface passivation material pulse S11 may be performed before the niobium precursor pulse S1 and the reactant pulse S3. Surface passivation treatment may be performed by pre-treatment PRE, niobium oxide may be deposited by the first cycle (NbO), and nitriding of niobium oxide may be performed by post-treatment PST.

The surface passivation material may include an organic compound containing hydrogen or hydrocarbon. For example, as the surface passivation material, an organic compound having a structure of X1-R1(R2)n-R3 or R1(R2)n-X2-R3 may be used. R1 and R2 may include hydrogen (H) or a linear, branched or cyclic hydrocarbon compound between C1 and C6. In this case, R1 and R2 may be the same or different from each other. R3 may be a linear hydrocarbon compound between C1-C5. X1 and X2 may be $CH_2$ or a compound of O, S and NH may be used. Also, X1 and X2 may be the same or different from each other.

The niobium precursor may include an organometallic compound including niobium. The niobium-containing organometallic compound may further include at least an alkyl group, an alkenyl group, a cycloalkyl group, a cycloalkenyl group, or an aryl group.

The purge gas may include an inert gas such as argon. As a reactant, $H_2O$, $O_3$ or $O_2$ may be used directly or simultaneously with plasma. In another embodiment, the reactant may use $N_2$ or $NH_3$ directly or simultaneously with plasma.

Post-treatment PST may be performed by using a reducing gas. For example, the reducing gas can be used directly with $H_2$, $D_2$ or $NH_3$ or may be used simultaneously with plasma.

In another embodiment, the interfacial material layer 22 may include titanium oxide, tantalum oxide, yttrium oxide, or molybdenum oxide. Titanium oxide, tantalum oxide, yttrium oxide, or molybdenum oxide may be formed by atomic layer deposition as shown in FIG. 4A. For example, atomic layer deposition of tantalum oxide may be performing by repeating a cycle of surface passivation material injection SP, purge, tantalum precursor (Ta-precursor) pulse, purge, reactant pulse (reactant) and purge several times.

In the chemical vapor deposition for forming the interface material layer 22, a surface passivation material is first flowed, and then a source material and a reactant may be simultaneously supplied. Here, the source material may include a niobium precursor, a titanium precursor, a tantalum precursor, an yttrium precursor, or a molybdenum precursor.

The pre-treatment PRE of FIG. 4B may be performed by using a reducing gas or an oxidizing gas. For example, as the reducing gas, a hydrogen-based gas such as $H_2$, $D_2$ or $NH_3$ may be used directly or a hydrogen-based gas may be used simultaneously with the plasma. As the oxidizing gas, an oxygen-based gas such as $H_2O$, $O_3$, $O_2$ or $H_2O_2$ may be used directly, or an oxygen-based gas may be used simultaneously with the plasma. The post-treatment PST of FIG. 4B may be performed by using a reducing gas. For example, the reducing gas can be used directly with $H_2$, $D_2$ or $NH_3$ or may be used simultaneously with plasma.

Referring to FIG. 4C, the atomic layer deposition of the NbO/NbON stack may include a pre-treatment PRE, a second cycle Nb, and a post-treatment PST. The second cycle Nb may be repeated several times. The second cycle Nb may include a niobium precursor pulse S1 and a purge S2. The pre-treatment PRE may be performed before the second cycle Nb. Surface passivation treatment may be performed by pre-treatment PRE, niobium may be deposited by second cycle Nb, and oxidation and nitridation of niobium may be performed by post-treatment PST. The post-treatment PST may include a first post-treatment PST1 and a second post-treatment PST2. The first post-treatment PST1 may be performed by using an oxidizing gas, and the second post-treatment PST2 may be performed by using a reducing gas. In the first post-treatment PST1, $H_2O$, $O_3$, $O_2$, or $H_2O_2$ may be directly used or used simultaneously with plasma. The second post-treatment PST2 may use $H_2$, $D_2$, or $NH_3$ directly or may be used simultaneously with plasma. In FIG. 4C, the reactant pulse and purge may not proceed, and therefore, if the post-treatment PST is performed in a state in which the niobium precursor is adsorbed, the niobium precursors present on the surfaces of the supporters may be desorbed.

Referring to FIGS. 4A to 4C, the pre-treatment PRE may passivate the surfaces of the supporters 16S and 18S and reduce the number of reactive species on the surfaces of the supporters 16S and 18S. Adsorption of niobium precursors on the surfaces of the supporters 16S and 18S may be suppressed by the pre-treatment PRE, thereby minimizing the deposition of the interfacial material layer 22 on the surfaces of the supporters 16S and 18S, the bridging of the interface material layer 22 may be prevented by suppressing the absorption.

Referring to FIGS. 4A to 4C, the post-treatment PST may use nitrate niobium oxide and may also desorb niobium oxide from the surfaces of the supporters 16S and 18S. The bridging of the interfacial material layer 22 may be prevented by such post-treatment PST.

Figure 3G:
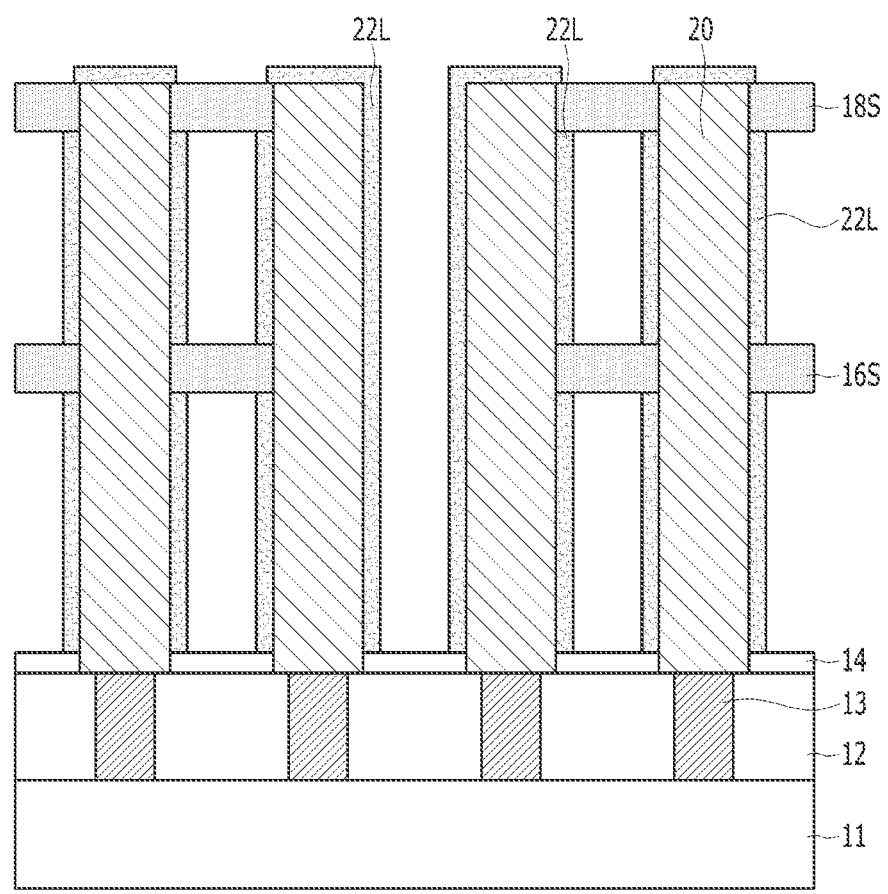

FIG. 3G illustrates the results after the post-treatment PST is performed, the interfacial material layer 22 may be selectively desorbed from the surfaces of the supporters 16S and 18S. Accordingly, the interfacial layer 22L may be formed on the surfaces of the lower electrodes 20. The interfacial layer 22L may not be formed on the surfaces of the upper-level supporter 18S and the lower-level supporter 16S.

In another embodiment, in order to remove the interfacial material layer 22 that may remain on the surface of the supporters 16S and 18S after the post-treatment PST, vapor phase etching such as ALE (Atomic Layer Etch) may be performed. ALE etching of the interfacial material layer 22 may use nitrogen trifluoride ($NF_3$), fluorine ($F_2$), or chlorine trifluoride ($ClF_3$). In another embodiment, the etching process for forming the interfacial layer 22L may use plasma or thermal. When the interfacial material layer 22 is exposed to the ALE etching, the second portions 22T may remain with a predetermined thickness even if all of the first portions 22S are etched. As a result, the interfacial layer 22L may be formed with a remaining portion of the second portions 22T of the interfacial material layer 22 of FIG. 3F. The interfacial layer 22L may be thinner than the second portions 22T of the interfacial material layer 22. Both the first portions 22S and the surface passivation materials 22P may be removed by vapor phase etching of the interface material layer 22.

A vertical structure including a plurality of lower electrodes 20 and lower-level and upper-level supporters 16S and 18S supporting the lower electrodes 20 may be formed on the substrate 11 by a series of processes as described above. The vertical structure may include an interfacial layer 22L.

Figure 3H:
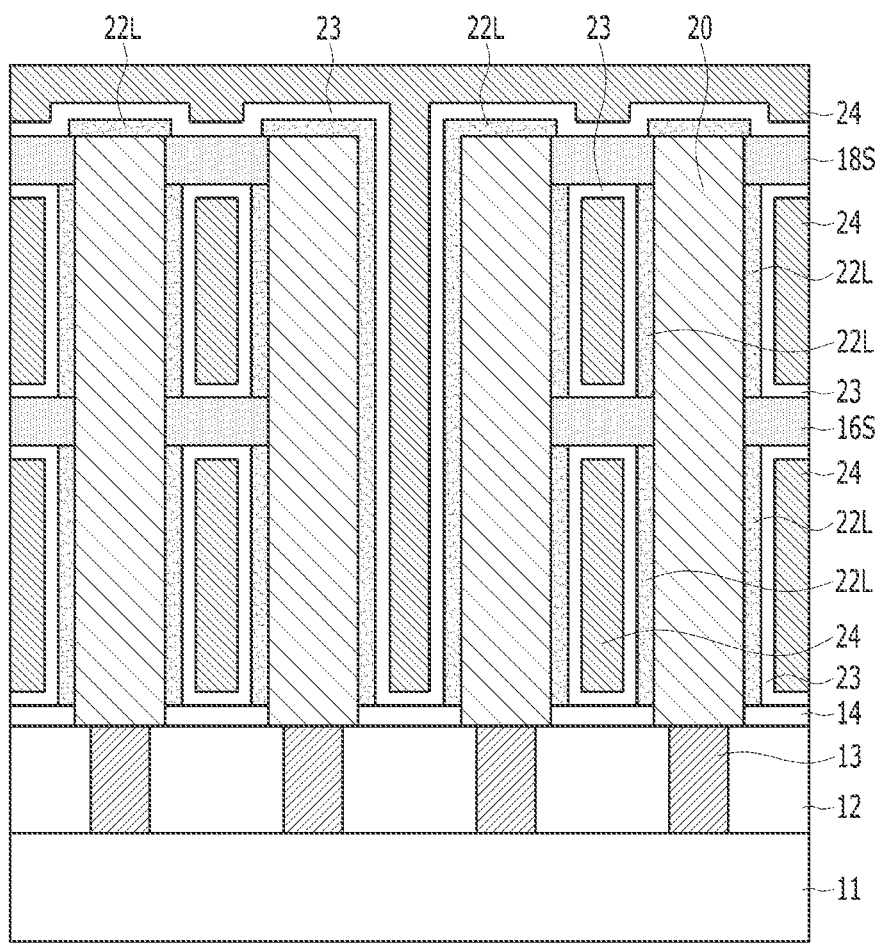

Subsequently, as shown in FIG. 3H, a dielectric layer 23 may be formed on the interfacial layer 22L and the supporters 16S and 18S, and an upper electrode 24 may be formed on the dielectric layer 23.

The interfacial material layer 22 forming process, the interfacial layer 22L forming process, and the dielectric layer 23 forming process may be performed in situ, for example, within an atomic layer deposition chamber.

The dielectric layer 23 may include a high-k material having a higher dielectric constant than silicon oxide. A high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer 23 may be formed of a composite layer including two or more layers of the aforementioned high-k material. In this embodiment, the dielectric layer 23 may be formed of a zirconium oxide-based material having good leakage current characteristics while sufficiently lowering the equivalent oxide thickness (EOT). For example, it may include a ZAZ ($ZrO_2/Al_2O_3/ZrO_2$) stack, a ZAZA ($ZrO_2/Al_2O_3/ZrO_2/Al_2O_3$) stack, or a ZAZAT ($ZrO_2/Al_2O_3/ZrO_2/Al_2O_3/TiO_2$) stack. In another embodiment, the dielectric layer 109 may include a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, or a $Ta_2O_5/HfO_2/Al_2O_3/HfO_2$ stack. In another embodiment, the dielectric layer 23 may include hafnium oxide having a tetragonal crystalline phase, and the interfacial layer 22L may serve as a seed layer promoting a tetragonal crystalline phase of hafnium oxide. In another embodiment, the dielectric layer 23 may include a HZAZH ($HfO_2/ZrO_2/Al_2O_3/ZrO_2/HfO_2$) stack, where H may be hafnium oxide having a tetragonal crystalline phase. In another embodiment, the dielectric layer 23 may include a ferroelectric material, an anti-ferroelectric material, or a combination thereof. In another embodiment, the dielectric layer 23 may include HfZrO, Hf-rich HfZrO, Zr-rich HfZrO, or a combination thereof.

The dielectric layer 23 and the lower electrodes 20 may not contact each other by the interfacial layer 22L. The outer walls of the lower electrodes 20 may be surrounded by the interfacial layer 22L. The interfacial layer 22L may extend vertically along sidewalls of the lower electrodes 20. An interfacial layer 22L may be formed between the dielectric layer 23 and the lower electrodes 20, and an interfacial layer 22L may not be formed between the dielectric layer 23 and the lower and upper level supporters 16S and 18S.

An upper electrode 24 may be formed on the dielectric layer 23. The upper electrode 24 may fill a space between the adjacent lower electrodes 20. The upper electrode 24 may extend to cover upper portions of the lower electrodes 20. The upper electrode 24 may include polysilicon, silicon germanium, metal, metal nitride, metal silicon nitride, conductive metal oxide, metal silicide, noble metal, or a combination thereof. The upper electrode 24 may include titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof. For example, the upper electrode 24 may be stacked in the order of titanium nitride (TiN), silicon germanium (SiGe), and tungsten nitride (WN).

As another embodiment, even when a single supporter applying only either of the upper-level supporter 18S or the lower-level supporter 16S is applied, the interfacial layer 22L may be applied.

As another embodiment, even when a multi-level supporter of at least three layers or more is applied, the interfacial layer 22L may be applied.

According to the above-described embodiments, the interfacial layer 22L may be formed only on the surfaces of the lower electrodes 20 by selective deposition and selective etching of the interfacial material layer 22. Therefore, it is possible to reduce the effective oxide film thickness and to improve the disturbance defect.

In addition, the step coverage of the dielectric layer 23 may be improved by selectively depositing and selectively etching the interfacial material layer 22.

Figure 5:
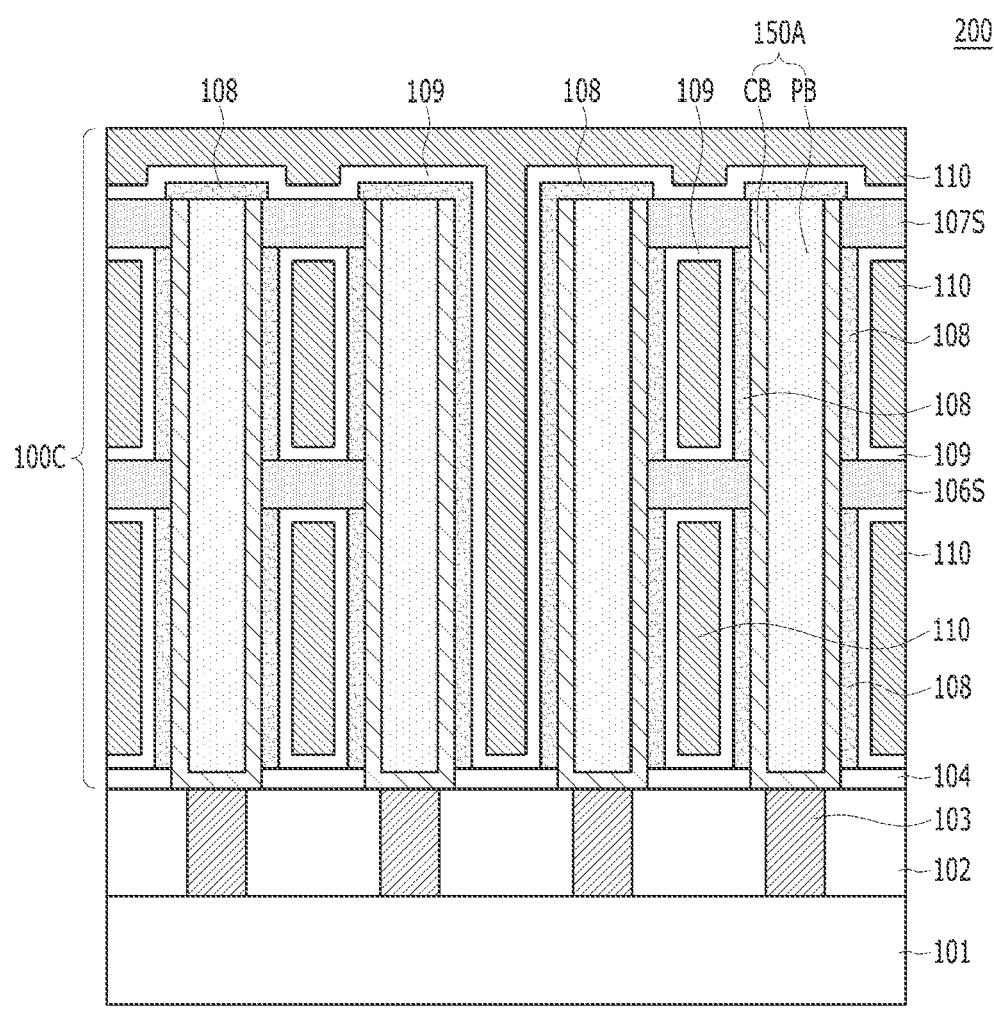
FIGS. 5 to 9 are diagrams illustrating semiconductor devices according to other embodiments of the present invention.

FIG. 5 is a diagram illustrating a semiconductor device according to another embodiment. The semiconductor device of FIG. 5 may be similar to the semiconductor device of FIG. 2.

Referring to FIG. 5, the semiconductor device 200 may include a capacitor structure 100C. The capacitor structure 100C may include a plurality of lower electrodes 150A, supporters 106S and 107S supporting the lower electrodes 150A, the lower electrodes 150A and a dielectric layer 109 disposed on the supporters 106S and 107S, and an upper electrode 110 disposed on the dielectric layer 109. The capacitor structure 100C may further include an interfacial layer 108 disposed between the lower electrodes 150A and the dielectric layer 109. Each of the lower electrodes 150A may be electrically connected to the substrate 101 through a contact plug 103. The contact plugs 103 may pass through the inter-dielectric layer 102 on the substrate 101 to be connected to the substrate 101. The contact plugs 103 may also be referred to as storage node contact plugs.

The lower electrodes 150A may include polysilicon, metal, metal nitride, conductive metal oxide, metal silicide, noble metal, or a combination thereof. The lower electrodes 150A may include at least one of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150A of FIG. 5 have a hybrid shape, and may include a cylindrical electrode CB and a pillar-shaped electrode PB filling the inside of the cylinder of the cylindrical electrode CB.

In the present embodiment, the cylindrical electrode CB may be made of titanium nitride, and the pillar-shaped electrode PB may be made of polysilicon.

The interfacial layer 108 may be disposed on sidewalls and top surfaces of the lower electrodes 150A. The interfacial layer 108 may be disposed between the lower electrodes 150A and the dielectric layer 109, and may not be formed between the dielectric layer 109 and the supporters 106S and 107S. The interfacial layer 108 may be selectively formed on the surface of the cylindrical electrode CB, and may be selectively formed on the upper surface of the pillar-shaped electrode PB.

Figure 6:
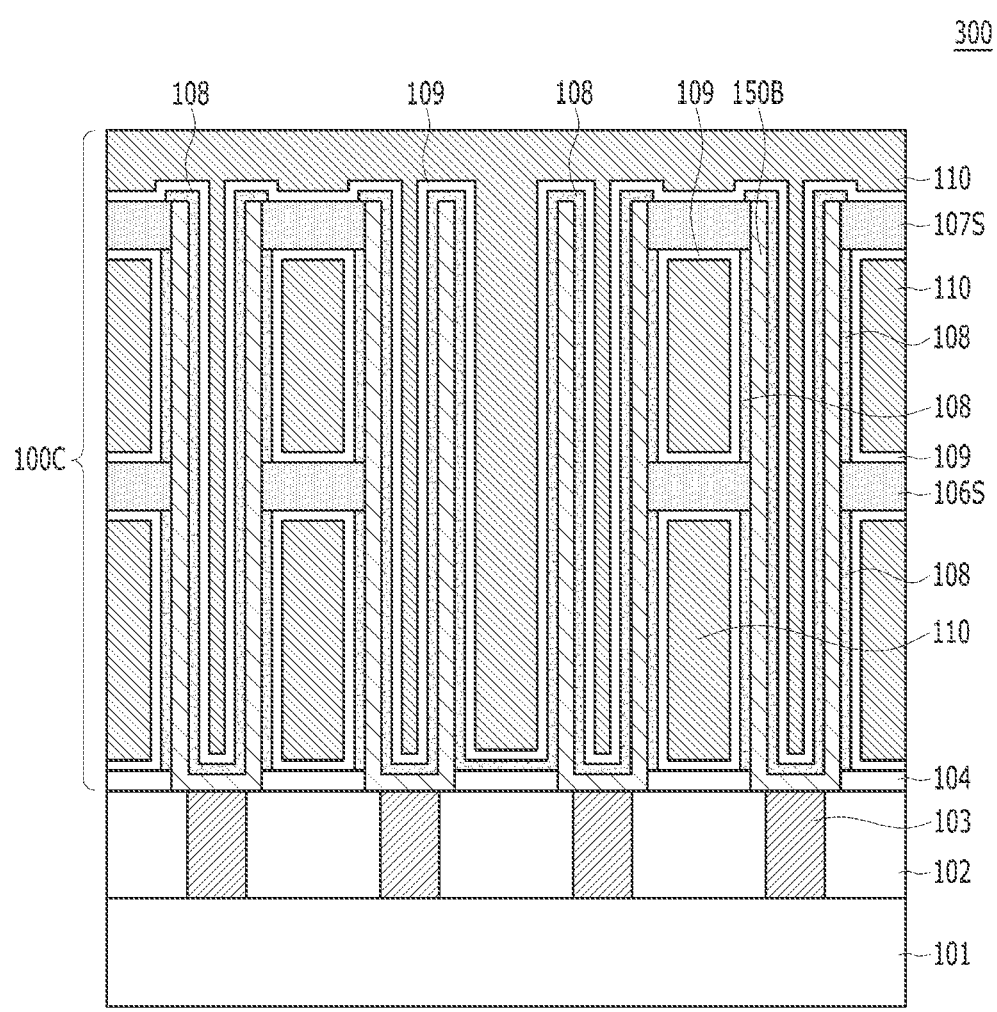

FIG. 6 is a diagram illustrating a semiconductor device according to another embodiment. The semiconductor device of FIG. 6 may be similar to the semiconductor device of FIG. 2.

Referring to FIG. 6, the semiconductor device 300 may include a capacitor structure 100C. The capacitor structure 100C may include a plurality of lower electrodes 150B, supporters 106S and 107S supporting the lower electrodes 150B, and a dielectric layer 109 disposed on the supporters 106S and 107S and an upper electrode 110. The capacitor structure 100C may further include an interfacial layer 108 disposed between the lower electrodes 150B and the dielectric layer 109. Each of the lower electrodes 150B may be electrically connected to the substrate 101 through a contact plug 103. The contact plugs 103 may pass through the inter-dielectric layer 102 on the substrate 101 to be connected to the substrate 101. The contact plugs 103 may also be referred to as storage node contact plugs. The lower electrodes 150B may include at least one of polysilicon, metal, metal nitride, conductive metal oxide, metal silicide, noble metal, or a combination thereof. The lower electrodes 150B may include at least one of titanium (Ti), titanium nitride (TiN), titanium silicon nitride (TiSiN), tantalum (Ta), tantalum nitride (TaN), titanium aluminum nitride (TiAlN), tungsten (W), and tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150B of FIG. 6 have a cylindrical shape, and the lower electrodes 150B may include, for example, titanium nitride. The interfacial layer 108 may be selectively formed on the inner and outer walls of the cylinders of the lower electrodes 150B. The interfacial layer 108 may be disposed between the lower electrodes 150B and the dielectric layer 109, and may not be formed between the dielectric layer 109 and the supporters 106S and 107S.

Figure 7:
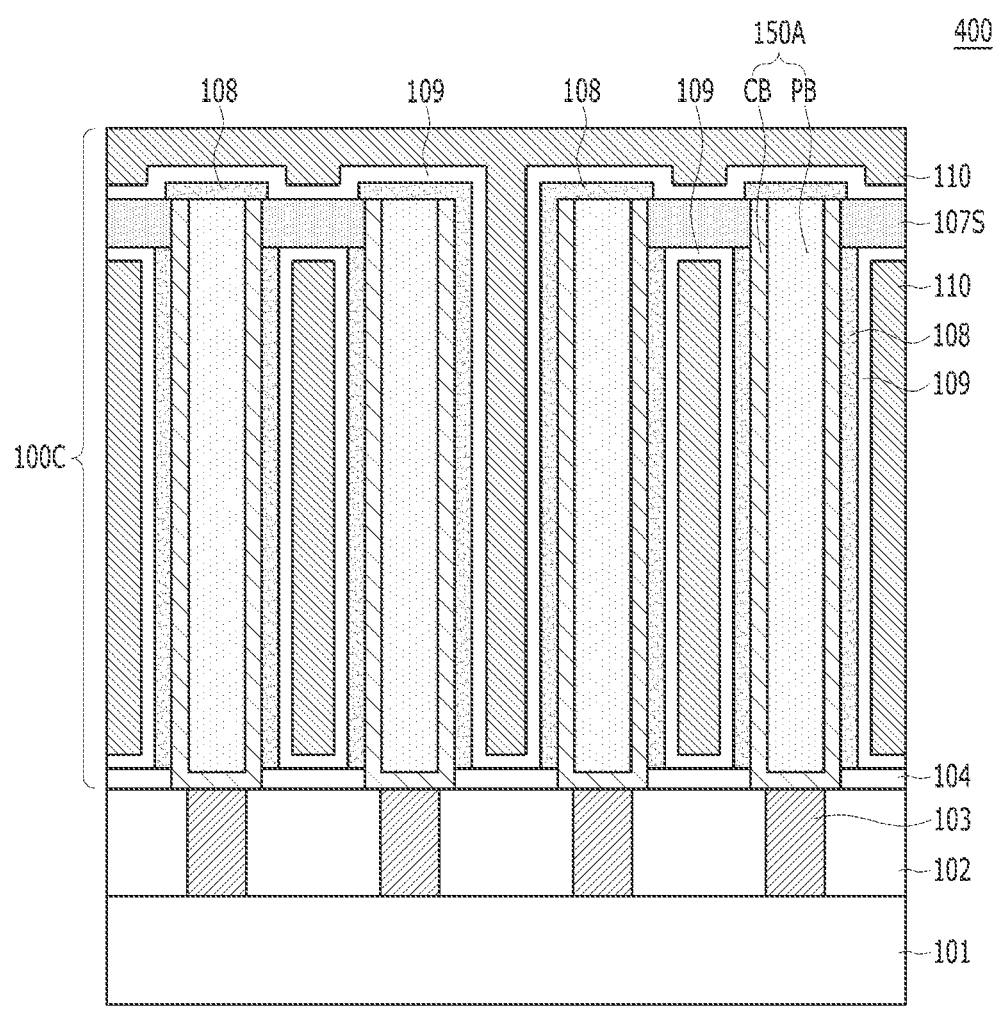

FIG. 7 is a diagram illustrating a semiconductor device according to another embodiment. The semiconductor device of FIG. 7 may be similar to the semiconductor device of FIGS. 2 and 5.

Referring to FIG. 7, the semiconductor device 400 may include a capacitor structure 100C. The capacitor structure 100C may include a plurality of lower electrodes 150A, a single supporter 107S supporting the lower electrodes 150A, a dielectric layer 109 disposed on the lower electrodes 150A and the single supporter 107S, and an upper electrode 110 disposed on the dielectric layer 109. The capacitor structure 100C may further include an interfacial layer 108 disposed between the lower electrodes 150A and the dielectric layer 109. Each of the lower electrodes 150A may be electrically connected to the substrate 101 through a contact plug 103. The contact plugs 103 may pass through the inter-dielectric layer 102 to be connected to the substrate 101. The contact plugs 103 may also be referred to as storage node contact plugs.

The lower electrodes 150A may include polysilicon, metal, metal nitride, conductive metal oxide, metal silicide, noble metal, or a combination thereof. The lower electrodes 150A may include at least one of titanium (Ti), titanium nitride (TiN), titanium silicon nitride (TiSiN), tantalum (Ta), tantalum nitride (TaN), titanium aluminum nitride (TiAlN), tungsten (W), and tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150A of FIG. 7 have a hybrid shape, and may include a cylindrical electrode CB and a pillar-shaped electrode PB filling the inside of the cylinder of the cylindrical electrode CB. In the present embodiment, the cylindrical electrode CB may be made of titanium nitride, and the pillar-shaped electrode PB may be made of polysilicon.

The interfacial layer 108 may be disposed on sidewalls and top surfaces of the lower electrodes 150A. The interfacial layer 108 may be formed between the lower electrodes 150A and the dielectric layer 109, and may not be formed between the dielectric layer 109 and the single supporter 107S. The interfacial layer 108 may be selectively formed on the surface of the cylindrical electrode CB, and may be selectively formed on the upper surface of the pillar-shaped electrode PB.

Figure 8:
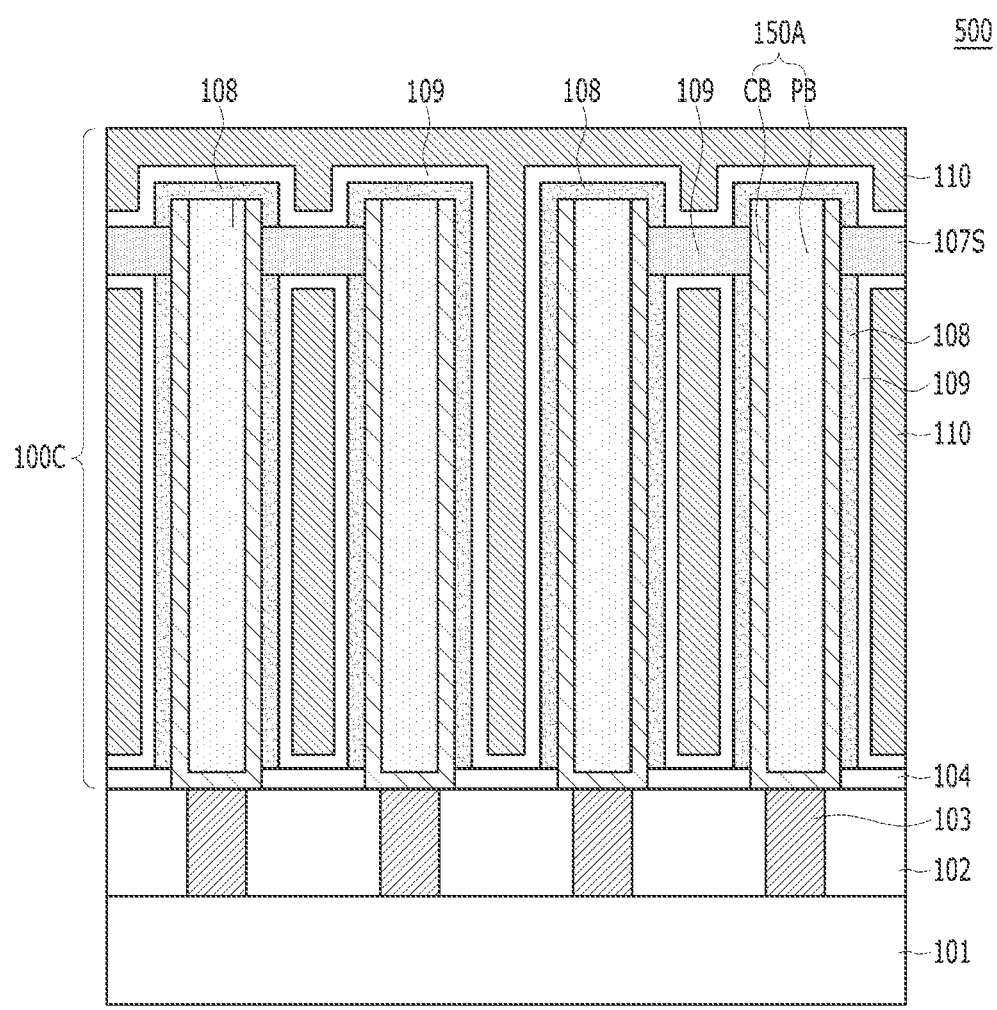

FIG. 8 is a diagram illustrating a semiconductor device according to another embodiment. The semiconductor device of FIG. 8 may be similar to the semiconductor device of FIG. 7.

Referring to FIG. 8, the semiconductor device 500 may include a capacitor structure 100C. The capacitor structure 100C may include a plurality of lower electrodes 150A, a single supporter 107S supporting the lower electrodes 150A, a dielectric layer 109 disposed on the lower electrodes 105A and the single supporter 107S, and an upper electrode 110 disposed on the dielectric layer 109. The capacitor structure 100C may further include an interfacial layer 108 disposed between the lower electrodes 150A and the dielectric layer 109. Each of the lower electrodes 150A may be electrically connected to the substrate 101 through a contact plug 103. The contact plugs 103 may pass through the inter-dielectric layer 102 on the substrate 101 to be connected to the substrate 101. The contact plugs 103 may also be referred to as storage node contact plugs.

The lower electrodes 150A may include polysilicon, metal, metal nitride, metal silicon nitride, conductive metal oxide, metal silicide, noble metal, or a combination thereof. The lower electrodes 150A may include at least one of titanium (Ti), titanium nitride (TiN), titanium silicon nitride (TiSiN), tantalum (Ta), tantalum nitride (TaN), titanium aluminum nitride (TiAlN), tungsten (W), and tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150A of FIG. 8 have a hybrid shape which includes a cylindrical electrode CB and a pillar-shaped electrode PB filling the inside of the cylinder of the cylindrical electrode CB. In the present embodiment, the cylindrical electrode CB may be made of titanium nitride, and the pillar-shaped electrode PB may be made of polysilicon.

The interfacial layer 108 may be disposed on sidewalls and top surfaces of the lower electrodes 150A. The interfacial layer 108 may be formed between the lower electrodes 150A and the dielectric layer 109. The interfacial layer 108 may not be formed between the dielectric layer 109 and the single supporter 107S. The interfacial layer 108 may be selectively formed on the surface of the cylindrical electrode CB. The interfacial layer 108 may be selectively formed on the upper surface of the pillar-shaped electrode PB.

The uppermost surface of the single supporter 107S of FIG. 8 may be disposed at a lower level than the uppermost surfaces of the lower electrodes 150A. Top surfaces and top sidewalls of the lower electrodes 150A exposed by the single supporter 107S may be covered by the interfacial layer 108. In an embodiment, the top sidewalls of the lower electrodes 150A are the part of the sidewalls of the lower electrodes 150A which are disposed at a level that is higher than level of the supporter 107S. As shown in embodiment of FIG. 8 the entire sidewalls of the lower electrodes 150A other than the portions covered by the single supporter 107S may be covered by the interfacial layer 108.

Figure 9:
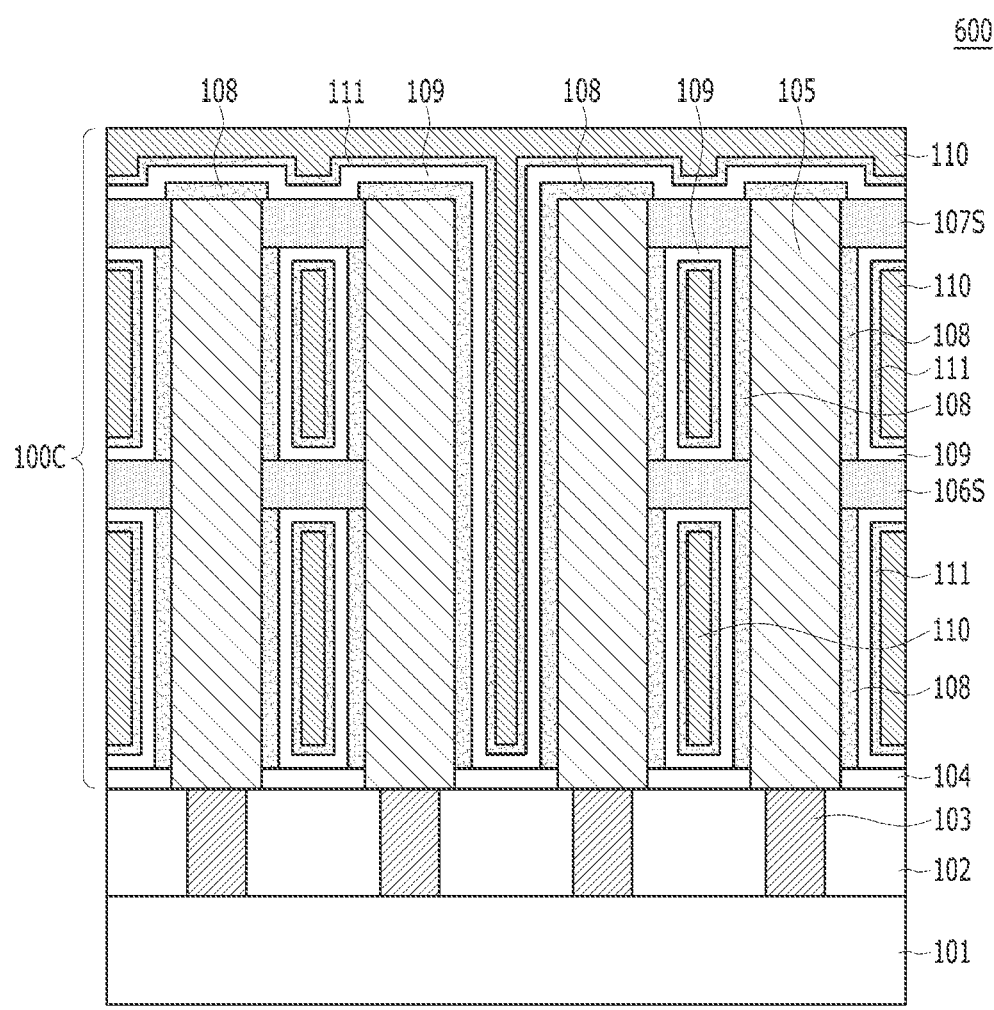

FIG. 9 is a diagram illustrating a semiconductor device according to another embodiment. The semiconductor device of FIG. 9 may be similar to the semiconductor device of FIG. 2.

Referring to FIG. 9, the semiconductor device 600 may include a capacitor structure 100C. The capacitor structure 100C may include a plurality of lower electrodes 105, supporters 106S and 107S supporting the lower electrodes 105, a dielectric layer 109 disposed on the lower electrodes 105 and the supporters 106S and 107S, and an upper electrode 110 disposed on the dielectric layer 109. The capacitor structure 100C may further include a first interfacial layer 108 disposed between the lower electrodes 105 and the dielectric layer 109. In an embodiment, the first interfacial layer 108 may be disposed on the top surface of each lower electrode 105. The first interfacial layer 108 may be disposed on the sidewall of each lower electrode except for those portions of the sidewall which are covered by the supporters 107S and 106S. Each of the lower electrodes 105 may be electrically connected to the substrate 101 through a corresponding contact plug 103. The contact plugs 103 may pass through the inter-dielectric layer 102 on the substrate 101 to be connected to the substrate 101. The contact plugs 103 may also be referred to as storage node contact plugs.

The capacitor structure 100C of FIG. 9 may further include a second interfacial layer 111 between the upper electrode 110 and the dielectric layer 109. The first interfacial layer 108 and the second interfacial layer 111 may be made of the same material or different materials. The first and second interfacial layers 108 and 111 may correspond to the second and second interfacial layers IFL1 and IFL2 of FIG. 1. The first interfacial layer 108 may include a first sub interfacial layer and a second sub interfacial layer, and the second interfacial layer 111 may include a third sub interfacial layer and a fourth sub interfacial layer.

The second interfacial layer 111 may serve to suppress leakage current of the dielectric layer 109. The second interfacial layer 111 may serve to amplify the dielectric constant of the dielectric layer 109. The second interfacial layer 111 may be formed by atomic layer deposition as shown in FIGS. 4A to 4C, or by atomic layer deposition in which surface passivation material pulse is omitted. In another embodiment, the second interfacial layer 111 may be formed by depositing niobium oxide alone as an initial material of the second interfacial layer 111, and the second interfacial layer 111 made of a stack of niobium oxide and niobium nitride may be formed by nitriding a portion of niobium oxide when depositing titanium nitride (TiN) as the upper electrode 110.

In another embodiment, the dielectric layer 109 may include a ZAZ ($ZrO_2/Al_2O_3/ZrO_2$), HAH ($HfO_2/Al_2O_3/HfO_2$) or HZAZH ($HfO_2/ZrO_2/Al_2O_3/ZrO_2/HfO_2$) stack, and a first interfacial layer 108 and the second interfacial layer 111 may include an NbO/NbON stack. An NZAZN stack, an NHAHN stack, or an NHZAZHN stack may be formed between the lower electrodes 105 and the upper electrode 110. In the NZAZN stack, NHAHN stack or NHZAZHN stack and NHZAZHN stack, N may refer to an NbO/NbON stack.

In another embodiment, the dielectric layer 109 may include ZAZA ($ZrO_2/Al_2O_3/ZrO_2/Al_2O_3$), and the first interfacial layer 108 and the second interfacial layer 111 may include an NbO/NbON stack. In this case, an additional interfacial layer may be further formed between the second interfacial layer 111 and the upper electrode 110. The additional interfacial layer may include $TiO_2$. Accordingly, a NZAZANT stack may be formed between the lower electrodes 105 and the upper electrode 110. As a variant, an additional interfacial layer may be formed between the dielectric layer 109 and the second interfacial layer 111 to form an NZAZATN stack between the lower electrodes 105 and the upper electrode 110.

In embodiments shown in FIGS. 5 to 9, the dielectric layer 109 may include hafnium oxide ($HfO_2$), zirconium oxide ($ZrO_2$), aluminum oxide ($Al_2O_3$), titanium oxide ($TiO_2$), tantalum oxide ($Ta_2O_5$), and niobium oxide ($Nb_2O_5$) or strontium titanium oxide ($SrTiO_3$). In another embodiment, the dielectric layer 109 may include a ZAZ ($ZrO_2/Al_2O_3/ZrO_2$) stack, a ZAZA ($ZrO_2/Al_2O_3/ZrO_2/Al_2O_3$) stack, a ZAZAT ($ZrO_2/Al_2O_3/ZrO_2/Al_2O_3/TiO_2$) stack, a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_2$ stack, $Ta_2O_5/ZrO_2/Al_2O_3/ZrO_2$ stack, a $Ta_2O_5/HfO_2/Al_2O_3/HfO_2$ stack, and a HZAZH ($HfO_2/ZrO_2/Al_2O_3/ZrO_2/HfO_2$) stack. In another embodiment, the dielectric layer 109 may include a ferroelectric material, an anti-ferroelectric material, or a combination thereof. In another embodiment, the dielectric layer 109 may include HfZrO, Hf-rich HfZrO, Zr-rich HfZrO, or a combination thereof.

In embodiments shown in FIGS. 5 to 9, the upper electrode 110 may include polysilicon, silicon germanium, metal, metal nitride, metal silicon nitride, conductive metal oxide, metal silicide, noble metal, or a combination thereof. The upper electrode 110 may include at least one of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof. For example, the upper electrode 110 may be stacked in the order of titanium nitride (TiN), silicon germanium (SiGe), and tungsten nitride (WN).

The present invention described above is not limited to the above-described embodiments and the accompanying drawings, and it would be apparent to those skilled in the art that various changes, substitution, and modifications can be made within the scope of the technical spirit of the present invention.

What is claimed is:

1. A method of fabricating a semiconductor device, the method comprising:
   forming a plurality of lower electrodes and a supporter supporting the lower electrodes on a substrate;
   performing a pre-treatment to form an adsorption inhibitor on a surface of the supporter;
   after the pre-treatment, selectively forming a first interfacial layer including a stack of a metal oxide and a metal nitride on surfaces of the lower electrodes;
   forming a dielectric layer over the first interfacial layer, the lower electrodes, and the supporter; and
   forming an upper electrode over the dielectric layer.

2. The method of claim 1,
   wherein the pre-treatment is performed by using an oxidizing gas or a reducing gas.

3. The method of claim 1,
   wherein the pre-treatment uses $H_2$, $D_2$, $NH_3$, $H_2O$, $O_3$, $O_2$, or $H_2O_2$ directly or simultaneously with plasma.

4. The method of claim 1,
   wherein the pre-treatment includes a process of adsorbing a surface passivation material onto a surface of the supporter among the lower electrodes and the supporter.

5. The method of claim 1,
   wherein the forming of the first interfacial layer includes:
   depositing the metal oxide; and
   exposing the metal oxide to a post-treatment to form the metal nitride.

6. The method of claim 1,
   wherein the post-treatment uses $H_2$, $D_2$, or $NH_3$ directly or simultaneously with plasma.

7. The method of claim 1,
   wherein the forming of the first interfacial layer includes:
   adsorbing a metal precursor; and
   exposing the adsorbed metal precursor to a post-treatment,
   wherein the post-treatment includes sequentially flowing an oxidizing gas and a reducing gas.

8. The method of claim 1,
   wherein the metal oxide includes niobium oxide, and the metal nitride includes niobium nitride or niobium oxynitride.

9. The method of claim 1,
   wherein the metal oxide includes titanium oxide, tantalum oxide, yttrium oxide or molybdenum oxide, and
   wherein the metal nitride includes titanium nitride, tantalum nitride, yttrium nitride or molybdenum nitride.

10. The method of claim 1,
wherein the dielectric layer includes zirconium oxide, hafnium oxide, HfZrO, a ZAZ ($ZrO_2/Al_2O_3/ZrO_2$) stack, a ZAZA ($ZrO_2/Al_2O_3/ZrO_2/Al_2O_3$) stack, a ZAZAT ($ZrO_2/Al_2O_3/ZrO_2/Al_2O_3/TiO_2$) stack, a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, $Ta_2O_5/HfO_2/Al_2O_3/HfO_2$ stack, a HZAZH ($HfO_2/ZrO_2/Al_2O_3/ZrO_2/HfO_2$) stack, a ZAH ($ZrO_2/Al_2O_3/HfO_2$) stack, a HAZ ($HfO_2/Al_2O_3/ZrO_2$) stack, a ZHAZHAT ($ZrO_2/HfO_2/Al_2O_3/ZrO_2/HfO_2/Al_2O_3/TiO_2$) stack or combinations thereof.

11. The method of claim 1,
wherein the lower electrode has a cylindrical shape, a pillar shape, or a combination thereof.

12. The method of claim 1, further comprising:
forming a second interfacial layer between the dielectric layer and the upper electrode.

13. The method of claim 12,
wherein the second interfacial layer includes a stack of niobium oxide and niobium nitride,
wherein the niobium oxide contacts the dielectric layer, and
wherein the niobium nitride contacts the upper electrode.

14. The method of claim 12,
wherein the second interfacial layer includes a stack of niobium oxide and niobium oxynitride,
wherein the niobium oxide contacts the dielectric layer, and
wherein the niobium oxynitride contacts the upper electrode.

15. The method of claim 12,
wherein the second interfacial layer includes one metal selected from a group consisting of tantalum, titanium, yttrium and molybdenum, and
wherein the second interfacial layer includes an oxide of the metal, a nitride of the metal, an oxynitride of the metal, or a combination thereof.

16. The method of claim 1,
wherein the supporter includes a multi-layered level supporter,
wherein the dielectric layer and the multi-layered level supporter are in direct contact with each other, and
wherein the dielectric layer and the multi-layered level supporter are in direct contact without the first interfacial layer.

* * * * *